(12) United States Patent
Satou et al.

(10) Patent No.: US 10,425,031 B2
(45) Date of Patent: *Sep. 24, 2019

(54) MOTOR DRIVER HAVING FUNCTION OF DETECTING INSULATION RESISTANCE

(71) Applicant: FANUC CORPORATION, Yamanashi (JP)

(72) Inventors: Hiroyasu Satou, Yamanashi (JP); Masaya Tateda, Yamanashi (JP); Youichirou Ooi, Yamanashi (JP); Akira Hirai, Yamanashi (JP); Kiichi Inaba, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/715,294

(22) Filed: Sep. 26, 2017

(65) Prior Publication Data

US 2018/0091083 A1 Mar. 29, 2018

(30) Foreign Application Priority Data

Sep. 28, 2016 (JP) ................................. 2016-190169

(51) Int. Cl.
*H02P 27/06* (2006.01)
*G01R 27/08* (2006.01)
(Continued)

(52) U.S. Cl.
CPC .............. *H02P 27/06* (2013.01); *G01R 27/08* (2013.01); *G01R 31/343* (2013.01); *G01R 31/346* (2013.01); *H02P 5/00* (2013.01)

(58) Field of Classification Search
CPC ...... H02P 27/06; H02P 21/141; H02P 21/146; B60L 3/0061; B60L 3/0069; B60L 3/04; B60W 10/08; Y02T 10/08
(Continued)

(56) References Cited

U.S. PATENT DOCUMENTS 6,381,110 B1 4/2002 Nagashima et al.
7,898,264 B2 3/2011 Horikoshi et al.
(Continued)

FOREIGN PATENT DOCUMENTS

CN 101499773 A 8/2009
CN 101769991 A 7/2010
(Continued)

*Primary Examiner* — Rina I Duda
(74) *Attorney, Agent, or Firm* — RatnerPrestia

(57) ABSTRACT

In a motor driver of the present invention, voltage and current values measured by a voltage and current detector and a voltage value measured by a voltage detector are determined as first measurement results, in the state of turning on semiconductor switching elements connected between a positive terminal of a capacitor and motor coils. Voltage and current values measured by the voltage and current detector and a voltage value measured by the voltage detector are determined as second measurement results, in the state of, as to a group A, turning on a semiconductor switching element connected between the positive terminal of the capacitor and the motor coil, and as to a group B, turning on semiconductor switching elements connected between a negative terminal of the capacitor and the motor coil. The insulation resistance values are calculated between the motor coils of each group A or B and a ground.

4 Claims, 9 Drawing Sheets

(51) Int. Cl.
*G01R 31/34* (2006.01)
*H02P 5/00* (2016.01)

(58) Field of Classification Search
USPC ............. 318/139, 798, 800, 801, 811, 599
See application file for complete search history.

(56) References Cited

U.S. PATENT DOCUMENTS

| | | | |
|---|---|---|---|
| 8,022,658 B2 | 9/2011 | Ide | |
| 8,115,428 B2* | 2/2012 | Williams | B62D 5/0481 |
| | | | 318/400.02 |
| 9,404,974 B2* | 8/2016 | Sato | G01R 31/346 |
| 9,762,171 B2* | 9/2017 | Tateda | H02P 27/06 |
| 2006/0022679 A1* | 2/2006 | Obata | G01R 31/346 |
| | | | 324/551 |
| 2006/0158197 A1* | 7/2006 | Horikoshi | G01R 31/343 |
| | | | 324/551 |
| 2009/0195205 A1* | 8/2009 | Ide | G01R 31/1227 |
| | | | 318/490 |
| 2010/0171511 A1* | 7/2010 | Horikoshi | G01R 31/1263 |
| | | | 324/551 |
| 2015/0194922 A1 | 7/2015 | Sato et al. | |
| 2015/0256116 A1* | 9/2015 | Tateda | B60L 3/0061 |
| | | | 318/504 |

FOREIGN PATENT DOCUMENTS

| | | |
|---|---|---|
| CN | 102769428 A | 11/2012 |
| CN | 103580555 A | 2/2014 |
| CN | 104767464 A | 7/2015 |
| CN | 104901589 A | 9/2015 |
| JP | 4565036 B2 | 10/2010 |
| JP | 2012154668 A | 8/2012 |
| JP | B-5065192 | 10/2012 |
| JP | 2015-169479 | 9/2015 |
| JP | 6017481 B | 10/2016 |

* cited by examiner

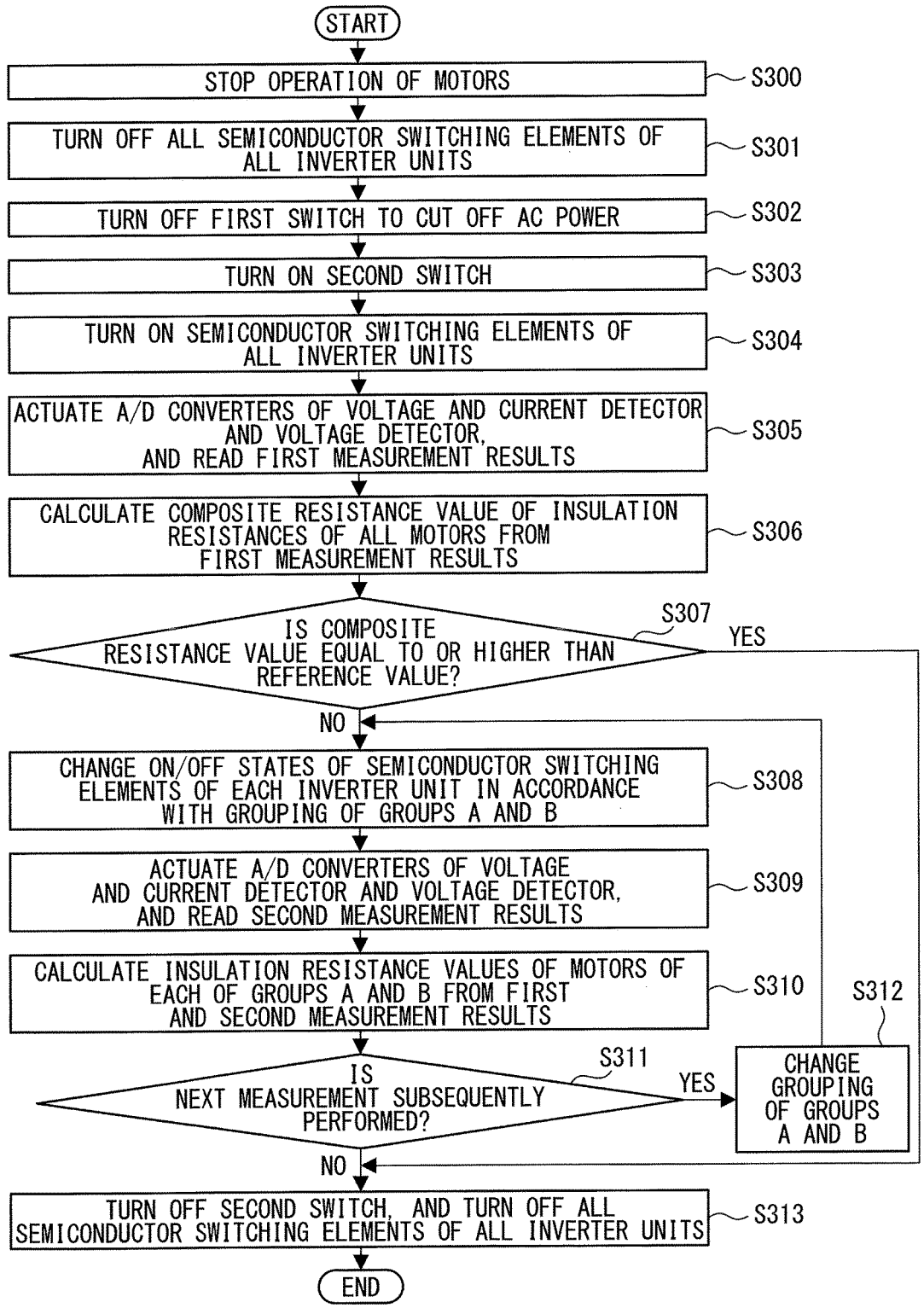

MOTOR DRIVER HAVING FUNCTION OF DETECTING INSULATION RESISTANCE

This application is a new U.S. patent application that claims benefit of JP 2016-190169 filed on Sep. 28, 2016, the content of 2016-190169 is incorporated herein by reference.

BACKGROUND OF THE INVENTION

1. Field of the Invention

The present invention relates to a motor driver for driving a plurality of motors, and specifically relates to a motor driver having the function of measuring the insulation resistance value of a motor and the function of detecting deterioration of insulation with high accuracy, without being affected by leakage currents flowing through semiconductor switching elements of inverter units.

2. Description of Related Art

Motor drivers that have the function of detecting the insulation resistance of motor windings by applying a voltage charged in a smoothing capacitor of a DC (direct current) link unit between the motor windings (coils) and a ground are already known (for example, Japanese Patent No. JP 5065192 (hereinafter referred to as Patent Document 1) and Japanese Unexamined Patent Publication (Kokai) No. JP 2015-169479 (hereinafter referred to as Patent Document 2)). Patent Document 1 describes a method for detecting the insulation resistance value of a motor in a motor driver having the function of detecting the insulation resistance value. In this method, after cutting off an AC (alternative current) power supply by a switch, one terminal of a smoothing capacitor of a DC power supply (DC link unit) connected to an inverter unit is connected to a ground. By turning on a plurality of semiconductor switching elements connected to the other terminal of the smoothing capacitor one by one in predetermined order, closed circuits, which are each constituted of the smoothing capacitor, the ground, motor coils, and the semiconductor switching element in an on state, are formed. A current detection circuit detects a current flowing through the closed circuit to detect the insulation resistance value of the motor.

Furthermore, Patent Document 1 also describes a method for detecting the insulation resistance value of a target motor in a motor driver having a plurality of inverter units for driving a plurality of motors. In this method, an arbitrary motor is chosen from the plurality of motors as the target motor. Since only a semiconductor switching element of the inverter unit connected to the chosen target motor is turned on, while all the other semiconductor switching elements of the inverter units connected to the non-target motors are turned off, a closed circuit having the insulation resistance of the target motor is generated.

In the conventional art described in Patent Document 1, in the motor driver having the plurality of inverter units for driving the plurality of motors, the semiconductor switching elements, which are originally provided in the inverter units, are used as switches for choosing the target motor. Thus, it is not necessary to additionally provide switches to switch the target motor by a number equal to the number of the motors. Moreover, one detection circuit measures the insulation resistance value of each of the motors, and therefore Patent Document 1 is a superior technique in terms of simple configuration and low cost.

However, the conventional art described in Patent Document 1 has a problem that, when a specific motor is chosen from the motors as the target motor in the motor driver having the inverters for driving the motors, if any one of the non-target motors has a reduced insulation resistance value, measurement accuracy is reduced at high temperature in which leakage currents of the semiconductor switching elements increase.

On the other hand, Patent Document 2 describes a method for detecting deterioration of insulation of a motor, without being affected by leakage currents of semiconductor switching elements in an off state, when an arbitrary motor is chosen from a plurality of motors as a target motor and the insulation resistance value of the target motor is measured. In this method, after cutting off an AC power supply by a switch, one terminal of a smoothing capacitor of a DC power supply (DC link unit) connected to inverter units is connected to a ground. Out of semiconductor switching elements of the inverter unit connected to the chosen target motor, the semiconductor switching elements that are connected between the other terminal of the capacitor and motor coils are turned on, as well as semiconductor switching elements of the non-target motors that are connected between the one terminal and the motor coils are turned on, in order to exclude semiconductor switching elements in an off state from a closed circuit having the insulation resistance of the target motor.

Patent Document 2 is a superior technique in terms of solving the problem of the conventional art of Patent Document 1, that is, measurement accuracy is reduced at high temperature in which leakage currents of semiconductor switching elements in an off state increase. However, the conventional art described in Patent Document 2 still has a problem that measurement accuracy is reduced when any one of non-target motors has a reduced insulation resistance value.

FIG. 1 shows the configuration of a motor driver having two inverter units for driving two motors, in which the conventional art disclosed in Patent Document 2 is used. By way of example, a first motor 1061 of the two motors is chosen as a target motor in FIG. 1.

A procedure for measuring the insulation resistance value of the motor in the conventional motor driver is as follows. First, in FIG. 1, all semiconductor switching elements (IGBTs) 10511 to 10561 and 10512 to 10562 of all inverter units 1051 and 1052 are turned off, and a first switch 1001 is turned off to separate an AC power supply 1002. Next, a second switch 1009 is turned on to connect a negative terminal 1043 of a DC link unit 1004 to a ground. FIG. 2 shows the connection of the insulation resistances between the IGBTs, the motors, and the ground in this state, as an equivalent circuit.

Next, in FIG. 1, since the first motor 1061 is chosen as the target motor, a U-phase upper arm IGBT 10511 of the first inverter unit 1051 connected to the first motor 1061 is turned on, as well as a U-phase lower arm IGBT 10522 of the second inverter unit 1052 connected to a second motor 1062 is turned on. A closed circuit (indicated by a dashed line in FIG. 1) having the insulation resistance between motor coils 10611 to 10631 of the target first motor 1061 and the ground is formed, and a current detector 1007 measures a current flowing through the closed circuit. At the same time, a voltage detector 1008 measures a DC link voltage, and thereby the insulation resistance value between the motor and the ground is calculated from the measured voltage value and current value.

FIG. 3 is an equivalent circuit during the measurement of the insulation resistance value. Since one of the upper arm IGBTs (10511, 10531 and 10551) of the first inverter unit 1051 is turned on, as well as one of the lower arm IGBTs (10522, 10542 and 10562) of the second inverter unit 1052 is turned on from the state of FIG. 2, the equivalent insulation resistance RU-IGBT1 of the upper arm IGBTs (10511, 10531 and 10551) of the first inverter unit 1051 and the equivalent insulation resistance RD-IGBT2 of the lower arm IGBTs (10522, 10542 and 10562) of the second inverter unit 1052 are shorted out in the equivalent circuit of FIG. 3.

In FIGS. 2 and 3, RU-IGBT1 represents the equivalent insulation resistance of the upper arm IGBTs (10511, 10531 and 10551) of the first inverter unit 1051 in an off state. RU-IGBT2 represents the equivalent insulation resistance of the upper arm IGBTs (10512, 10532 and 10552) of the second inverter unit 1052 in an off state. RD-IGBT1 represents the collector-emitter equivalent insulation resistance of the lower arm IGBTs (10521, 10541 and 10561) of the first inverter unit 1051 in an off state. RD-IGBT2 represents the collector-emitter equivalent insulation resistance of the lower arm IGBTs (10522, 10542 and 10562) of the second inverter unit 1052 in an off state. Rm1 represents the insulation resistance between the motor coils (10611 to 10631) of the first motor 1061 and the ground. Rm2 represents the insulation resistance between motor coils (10612 to 10632) of the second motor 1062 and the ground. Rc represents serial connection of a voltage dividing resistance 1072 and a current detection resistance 1071 of the current detector 1007, as one resistance.

In the three-phase inverter unit for driving the three-phase motor, as shown in FIG. 1, the inverter unit is constituted of the three upper arm semiconductor switching elements (IGBTs) and the three lower arm semiconductor switching elements (IGBTs). Collector terminals and emitter terminals of the three upper or lower arm IGBTs are connected in parallel in the same inverter unit through the DC link unit and the motor coils inside the motor. Thus, in the equivalent circuits of FIGS. 2 and 3, the upper arm IGBTs of each inverter unit are represented as one equivalent insulation resistance in which the three IGBTs are connected in parallel. The lower arm IGBTs of each inverter unit are represented as one equivalent insulation resistance in which the three IGBTs are connected in parallel.

SUMMARY OF THE INVENTION

In the conventional art described in Patent Document 2, in a motor driver including a plurality of inverter units for driving a plurality of motors, when a specific motor is chosen as a target motor and the insulation resistance value of the target motor is, detected, the insulation resistance of the non-target motor is connected in parallel with a current detector. Thus, a current to be measured, which is intended to flow through the insulation resistance of the target motor, partly flows through the insulation resistance of the non-target motor, without passing through the current detector. Thus, a current value measured by the current detector is unequal to the current that flows through the insulation resistance of the target motor. Especially when the non-target motor includes a motor having a reduced insulation resistance value, measurement accuracy of the insulation resistance value of the specific target motor is significantly reduced.

To be more specific, as is apparent from FIG. 3, the problem of the conventional art is that, since the insulation resistance Rm2 of the non-target second motor is connected in parallel with the current detector 1007, a part (arrows of alternate long and short dashed lines) of a current to be measured (the sum of arrows of dotted lines and the arrows of alternate long and short dashed lines), which flows through the insulation resistance Rm1 between the target first motor and the ground, flows into the insulation resistance Rm2 of the non-target second motor without passing through the current detector 1007.

As described above, the conventional art described in Patent Document 2 has the fundamental problem that, since the insulation resistance of the non-target motor is connected in parallel with the current detector, the insulation resistance of the non-target motor affects measurement accuracy of the insulation resistance value of the target motor. Therefore, especially when the non-target motor includes a motor having a reduced insulation resistance value, measurement accuracy of the insulation resistance value of the specific target motor is significantly reduced.

Considering the problems described above, the present invention aims at providing a motor driver that can measure the insulation resistance value of a specific motor, out of a plurality of motors including a motor having a reduced insulation resistance value, with the use of semiconductor switching elements originally provided in inverter units as switches for choosing the specific motor. The present invention also aims at providing a motor driver that can measure the insulation resistance value of a motor and detect deterioration of insulation with high accuracy and simple configuration, without having an effect of a leakage current flowing through the insulation resistance of a non-target motor and without having effects of leakage currents of semiconductor switching elements, even when the non-target motor includes a motor having a reduced insulation resistance value.

A motor driver according to an embodiment of the present invention includes a converter unit having a rectifier circuit configured to rectify an AC voltage supplied from an AC power supply through a first switch to a DC voltage; a power supply unit configured to smooth the DC voltage rectified by the rectifier circuit using a capacitor; a plurality of inverter units configured to convert the DC voltage from the power supply unit into an AC voltage by switching operation of an upper arm semiconductor switching element connected between a positive terminal of the capacitor and a motor coil and a lower arm semiconductor switching element connected between a negative terminal of the capacitor and the motor coil, to drive a plurality of motors; a second switch configured to connect one terminal of the capacitor to a ground; a voltage and current detector configured to measure a current flowing between the one terminal of the capacitor and the ground, and a voltage between the one terminal of the capacitor and the ground; a voltage detector configured to measure a voltage across the capacitor; and an insulation resistance detector configured to detect the insulation resistance value of each of the motors driven by the inverter units. The insulation resistance detector determines a voltage value and a current value measured by the voltage and current detector and a voltage value measured by the voltage detector as first measurement results, in the state of stopping the operation of the motors, turning off the first switch while turning on the second switch, and turning on the semiconductor switching element of every motor that is connected between the other terminal of the capacitor and the motor coil, out of the upper arm or lower arm semiconductor switching element of the inverter unit connected to each motor. The insulation resistance detector determines a voltage value and a current value measured by the voltage and current detector and a voltage value measured by the voltage detector as second measurement results, in the state of dividing all the motors into two arbitrary groups i.e. a group A and a group B, and as to the motor belonging the group A, turning on the semiconductor switching element connected between the other terminal of the capacitor and the motor coil, out of the upper arm or lower arm semiconductor switching element of the inverter unit connected to each motor, and as to the motor belonging to the group B, turning on the semiconductor switching element connected between the one terminal of the capacitor and the motor coil, out of the upper arm or lower arm semiconductor switching element of the inverter unit connected to each motor. The insulation resistance detector calculates insulation resistance values between the coil of the motor belonging to the group A and the ground and between the coil of the motor belonging to the group B and the ground, using the first measurement results and the second measurement results.

BRIEF DESCRIPTION OF THE DRAWINGS

The objects, features, and advantages of the present invention will become more apparent from the following detailed description of embodiments, along with accompanying drawings. In the accompanying drawings:

FIG. 13 is a flowchart of a procedure for detecting deterioration of insulation using a motor driver according to a third embodiment of the present invention.

DETAILED DESCRIPTION OF THE INVENTION

Figure 1:
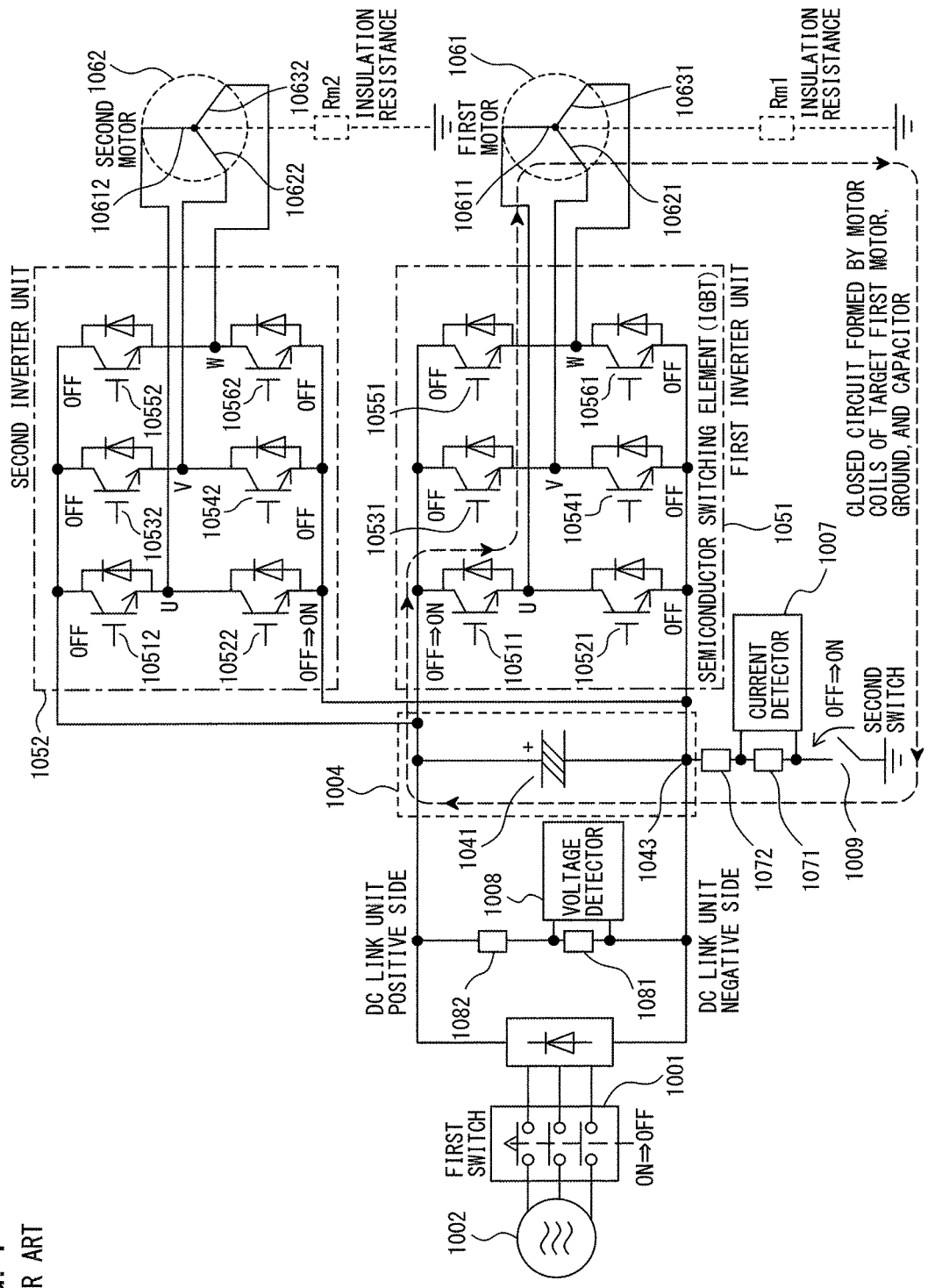
FIG. 1 is a block diagram of a motor driver having two inverter units for driving two motors, in which the conventional art is used.
Figure 2:
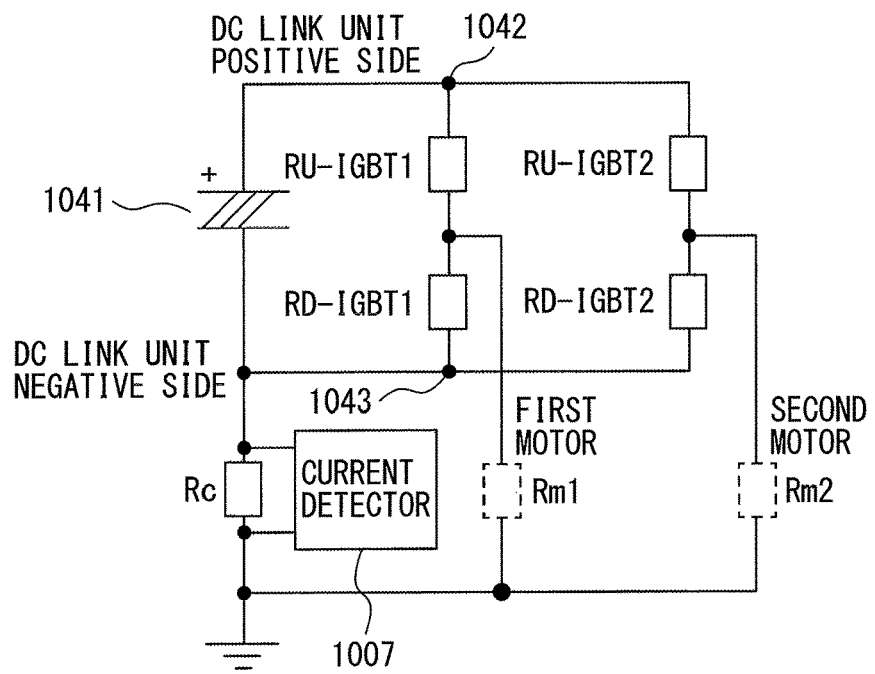
FIG. 2 is a drawing of an equivalent circuit showing the connection of the insulation resistances between IGBTs, motors, and a ground.
Figure 3:
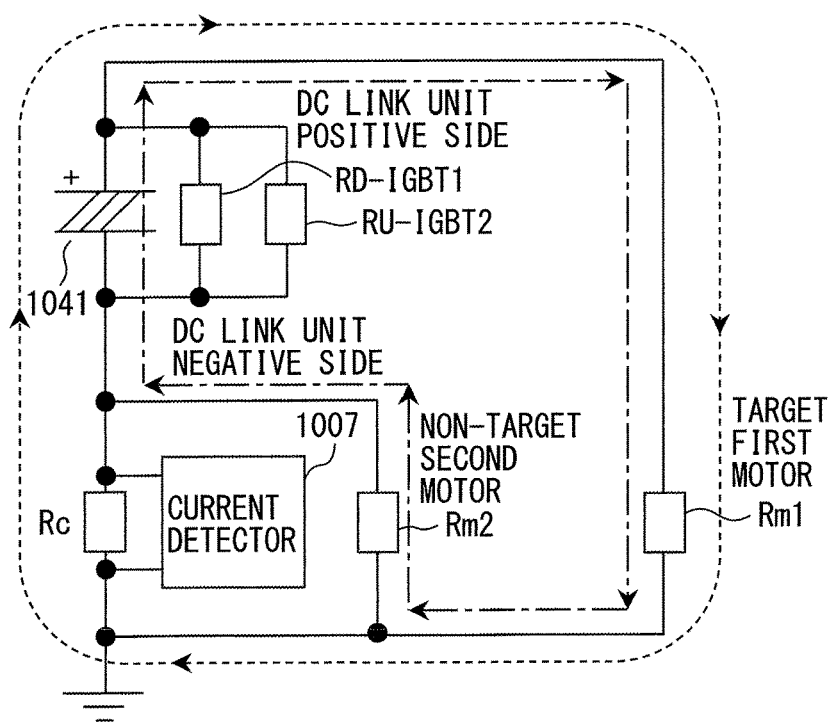
FIG. 3 is an equivalent circuit in which the equivalent insulation resistance of upper arm IGBTs of a first inverter unit and the equivalent insulation resistance of lower arm IGBTs of a second inverter unit are shorted out.
Figure 4:
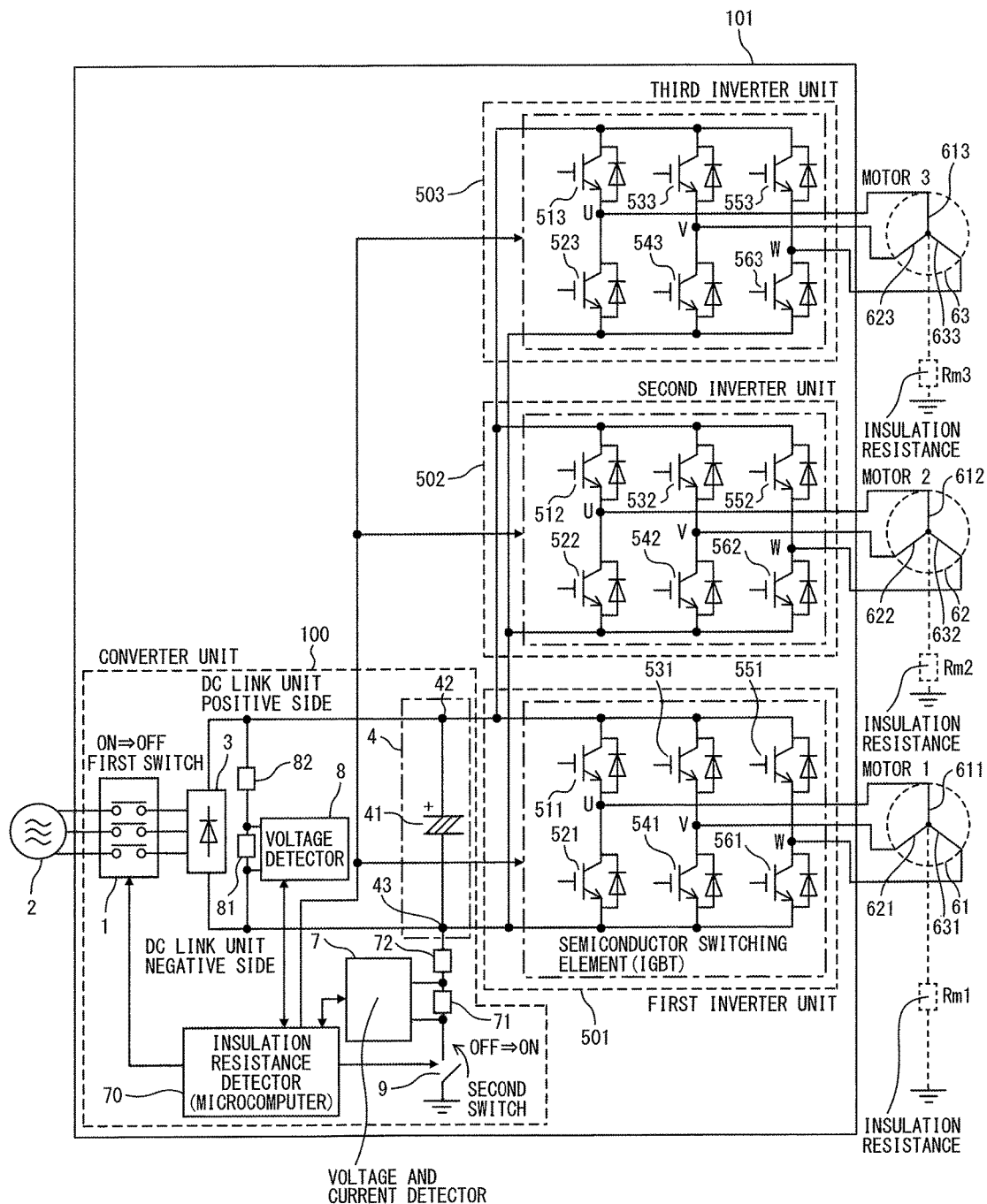
FIG. 4 is a block diagram of a motor driver having an insulation resistance detector according to a first embodiment of the present invention.

A motor driver according to a first embodiment of the present invention will be described. FIG. 4 is a block diagram of a motor driver having an insulation resistance detector according to the first embodiment of the present invention.

A motor driver 101 according to the first embodiment of the present invention includes a converter unit 100, a power supply unit 4, a plurality of inverter units 501 to 503, a second switch 9, a voltage and current detector 7, a voltage detector 8, and an insulation resistance detector 70.

The converter unit 100 has a rectifier circuit 3 that rectifies an AC (alternative current) voltage supplied from an AC power supply 2 through a first switch 1 to a DC (direct current) voltage.

The power supply unit 4 smooths the DC voltage rectified by the rectifier circuit 3 using a capacitor 41.

The first inverter unit 501, the second inverter unit 502, and the third inverter unit 503 convert the DC voltage from the power supply unit 4 (DC link unit) into an AC voltage by switching operation of semiconductor switching elements (IGBTs) to drive motors 61 to 63.

Each of the inverter units 501 to 503 includes upper arm semiconductor switching elements (511, 531, 551, 512, 532, 552, 513, 533 and 553) and lower arm semiconductor switching elements (521, 541, 561, 522, 542, 562, 523, 543 and 563).

The upper arm semiconductor switching elements (511, 531, 551, 512, 532, 552, 513, 533 and 553) are connected between a DC link unit positive terminal 42 i.e. a positive terminal of the capacitor 41 and motor coils (611, 621, 631, 612, 622, 632, 613, 623 and 633).

The lower arm semiconductor switching elements (521, 541, 561, 522, 542, 562, 523, 543 and 563) are connected between a DC link unit negative terminal 43 i.e. a negative terminal of the capacitor 41 and motor coils (611, 621, 631, 612, 622, 632, 613, 623 and 633).

The second switch 9 connects one terminal of the capacitor 41 to a ground.

The voltage and current detector 7 measures a voltage between the one terminal of the capacitor 41 and the ground, and a current flowing between the one terminal of the capacitor 41 and the ground.

The voltage detector 8 measures the voltage across the capacitor 41.

The insulation resistance detector 70 stops the operation of the motors 61 to 63. The insulation resistance detector 70 turns off the first switch 1, while turning on the second switch 9, and detects insulation resistance values between the coils of the motor belonging to a group A and the ground, and between the coils of the motors belonging to a group B and the ground, using first measurement results and second measurement results described below.

The first measurement results include a voltage value and a current value measured by the voltage and current detector 7 and a voltage value measured by the voltage detector 8, in the state of turning on the semiconductor switching element of every motor (61 to 63) that is connected between the other terminal of the capacitor 41 and the motor coil, out of the upper arm or lower arm semiconductor switching elements of the inverter unit connected to each motor.

The second measurement results are obtained as follows.

First, all the motors are divided into arbitrary two groups, i.e. a group A and a group B. As to one or a plurality of motors belonging to the group A, a semiconductor switching element that is connected between the other terminal of the capacitor and the motor coil is turned on, out of the upper arm or lower arm semiconductor switching elements of the inverter unit connected to each motor.

Furthermore, as to one or a plurality of motors belonging to the group B, a semiconductor switching element that is connected between the one terminal of the capacitor and the motor coil is turned on, out of the upper arm or lower arm semiconductor switching elements of the inverter unit connected to each motor.

The second measurement results include a voltage value and a current value measured by the voltage and current detector 7 and a voltage value measured by the voltage detector 8 in this state.

In FIG. 4, the first inverter unit 501 for driving the first motor 61, the second inverter unit 502 for driving the second motor 62, and the third inverter unit 503 for driving the third motor 63 are connected to the one power supply unit 4. Rm1 represents the insulation resistance between motor coils of the first motor 61 and the ground. Rm2 represents the insulation resistance between motor coils of the second motor 62 and the ground. Rm3 represents the insulation resistance between motor coils of the third motor 63 and the ground.

FIG. 4 shows the motor driver for driving the three motors 61 to 63, but the number of motors is not limited thereto in the present invention.

As shown in FIG. 4, the motor driver 101 according to the first embodiment of the present invention includes the converter unit 100, the capacitor 41, the first inverter unit 501, the second inverter unit 502, the third inverter unit 503, and the insulation resistance detector 70.

The capacitor 41 smooths the output of the rectifier circuit 3.

The insulation resistance detector 70 detects insulation resistance values Rm1, Rm2 and Rm3 of the first motor 61, the second motor 62, and the third motor 63 driven by the first inverter unit 501, the second inverter unit 502, and the third inverter unit 503, respectively.

To measure the insulation resistance values, the motor driver 101 according to the first embodiment of the present invention further includes the second switch 9 for connecting one end (DC link unit negative terminal 43) of the capacitor 41 to the ground, the voltage and current detector 7 (including an A/D converter (not shown) for converting an output of the voltage and current detector 7 into a digital value), and the voltage detector 8 (including an A/D converter (not shown) for converting an output of the voltage detector 8 into a digital value).

The voltage and current detector 7 measures a current flowing between the one terminal (e.g. the DC link unit negative terminal 43) of the capacitor 41 and the ground, and the voltage between the one terminal of the capacitor 41 and the ground, upon turning on the second switch 9.

The voltage detector 8 measures a voltage across the capacitor 41.

This embodiment describes a case in which, out of the three motors i.e. the first motor 61, the second motor 62, and the third motor 63, the first motor 61 that is chosen as a target motor belongs to a group A, while the non-target second motor 62 and third motor 63 belong to a group B. An insulation resistance value of the first motor 61 belonging to the group A is measured.

Figure 5:
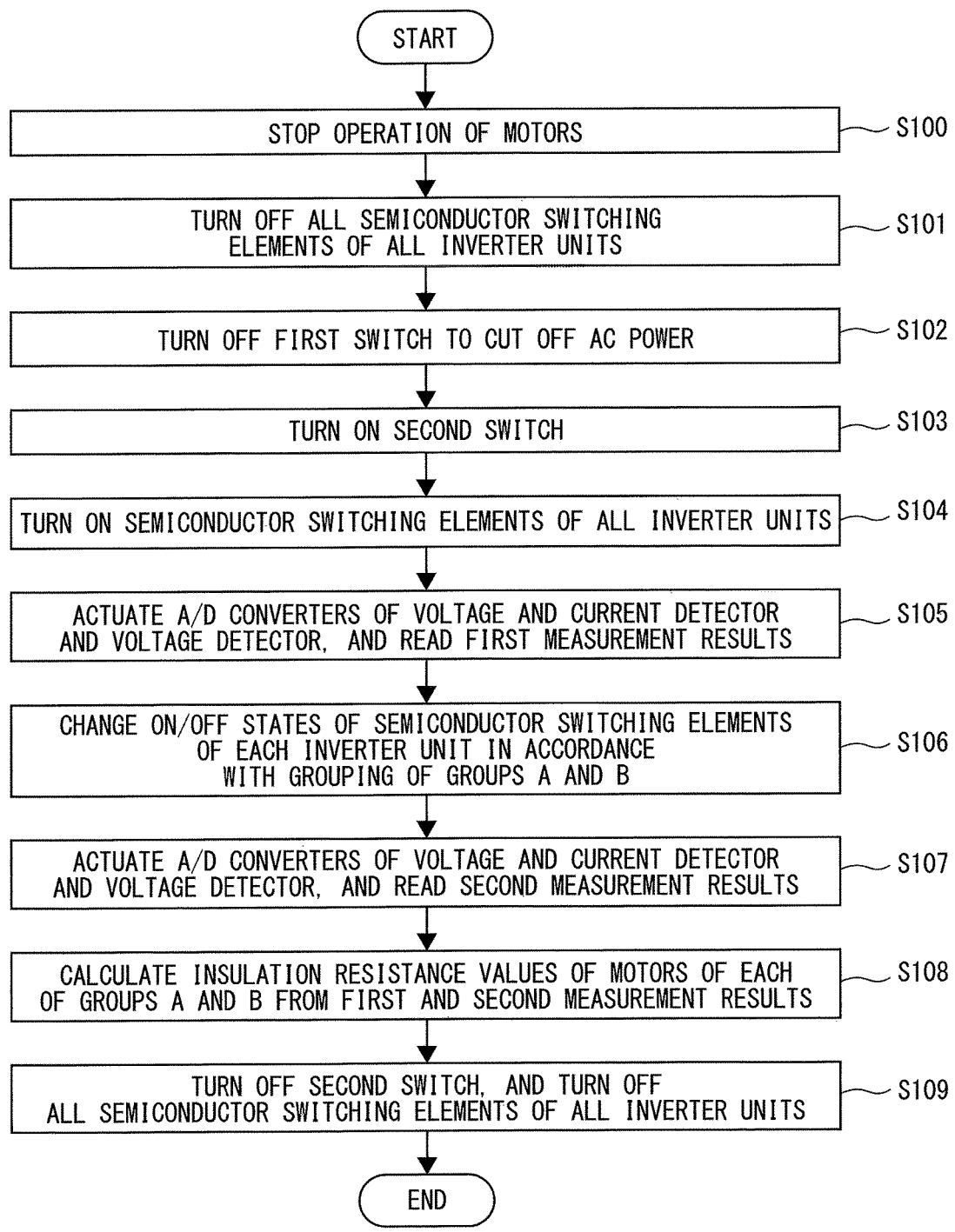
FIG. 5 is a flowchart of a procedure for a method for detecting an insulation resistance value using the motor driver according to the first embodiment of the present invention.

An insulation resistance value of a motor is measured as follows. FIG. 5 is a flowchart of a procedure for a method for detecting an insulation resistance value using the motor driver according to the first embodiment of the present invention. When measuring the insulation resistance value of the motor, the insulation resistance detector 70 stops the operation of all of the motors 61 to 63 in step S100, and turns off all the semiconductor switching elements (511 to 561, 512 to 562, and 513 to 563) of every inverter unit in step S101. Next, in step S102, the first switch 1 is turned off to cut off the AC power supply 2. Next, in step S103, the second switch 9 is turned on to connect one end of the capacitor 41, i.e. the DC link unit negative terminal 43 of the power supply unit 4 in the example of FIG. 4, to the ground.

Figure 6:
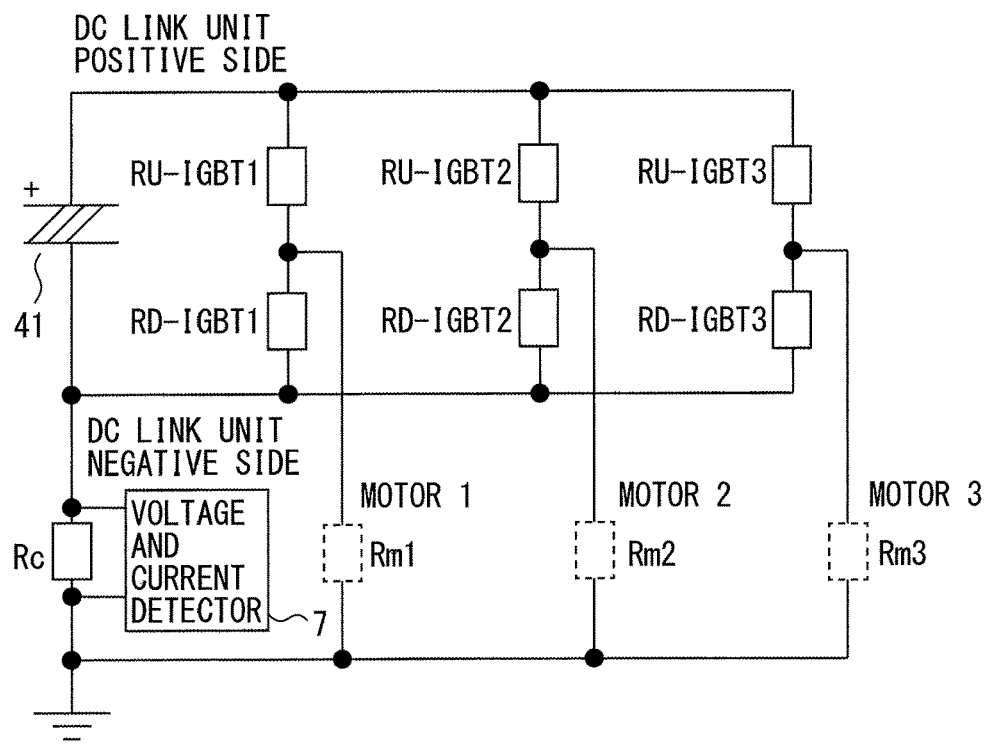
FIG. 6 is an equivalent circuit that shows the connection of the insulation resistances between IGBTs, motors, and a ground using the equivalent insulation resistances of IGBTs in the motor driver according to the first embodiment of the present invention.

FIG. 6 shows the connection of the insulation resistance between the IGBTs, the coils of the motors, and the ground in this state, using equivalent insulation resistances of the IGBTs, as an equivalent circuit. The equivalent insulation resistance of the IGBTs is a collector-emitter equivalent insulation resistance of the IGBTs in an off state that is obtained by dividing a voltage applied between collectors and emitters of the IGBTs in the off state of the IGBTs by a leakage current flowing from the collectors to the emitters in the off state.

Next, in step S104, semiconductor switching elements of every inverter unit that are connected between the other terminal of the capacitor and the motor coils of the motor are turned on, out of the upper arm or lower arm semiconductor switching elements, so that all the motor coils have the same potential as the other terminal of the capacitor.

In the example of FIG. 4, at least one IGBT of the upper arm semiconductor switching elements of the first inverter unit 501, at least one IGBT of the upper arm semiconductor switching elements of the second inverter unit 502, and at least one IGBT of the upper arm semiconductor switching elements of the third inverter unit 503 are turned on, in order to make the motor coils of all the motors have the same potential as the other terminal of the capacitor.

In the example of FIG. 4, the second switch 9 connects the DC link unit negative terminal 43 i.e. the negative terminal of the capacitor 41 to the ground. Thus, in every inverter unit (501, 502 and 503), the upper arm IGBTs (511, 531 and 551) that are connected between the DC link unit positive terminal 42, which is the positive terminal of the capacitor 41 on the opposite side to a side connected to the ground through the second switch 9, and the motor coils (611, 621, 631, 612, 622, 632, 613, 623 and 633) are turned on.

At this time, the IGBT of any phase, out of three phases i.e. a U-phase, a V-phase, and a W-phase, may be turned on as long as the IGBT is the upper arm IGBT, and the number of the IGBTs to be turned on may be one or two or more. This is because since the U-phase, V-phase and W-phase coils are connected each other inside the motor, turning on the IGBT of at least one phase makes the coil of every phase have the same potential as the other terminal of the capacitor inside the motor.

In this embodiment, as shown in FIG. 4, only the U-phase IGBT 511 is turned on in the first inverter unit 501, only the V-phase IGBT 532 is turned on in the second inverter unit 502, and only the W-phase IGBT 553 is turned on in the third inverter unit 503.

The coils of all the motors, in other words, the motor coils (611, 621 and 631) of the first motor 61, the motor coils (612, 622 and 632) of the second motor 62, and the motor coils (613, 623 and 633) of the third motor 63 thereby have the same potential as the DC link unit positive terminal 42.

On the other hand, the ground is connected to the DC link unit negative terminal 43 through the second switch 9. Therefore, a closed circuit having the capacitor 41, the upper arm IGBTs (511, 532 and 553) of each inverter unit in an on state, the insulation resistances between the motor coils (611, 621 and 631, or 612, 622 and 632, or 613, 623 and 633) of each motor and the ground, and the voltage and current detector 7 is formed.

Next, in step S105, the voltage and current detector 7 measures a voltage value and a current value, and the voltage detector 8 measures a voltage value. The obtained current value and the voltage values constitute first measurement results.

Figure 7:
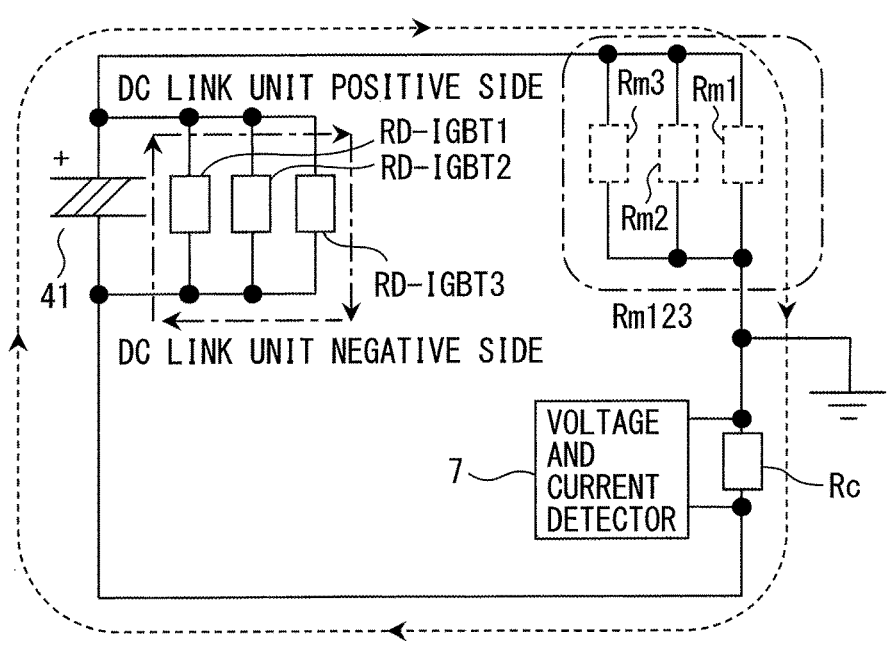
FIG. 7 is an equivalent circuit when measuring first measurement results, in the embodiment of FIG. 4.

FIG. 7 is an equivalent circuit when measuring the "first measurement results", in the embodiment of FIG. 4. One (511, 532 and 553) of the upper arm IGBTs is turned on from the state of FIG. 6, in each of the first inverter unit 501, the second inverter unit 502, and the third inverter unit 503. Thus, in an equivalent circuit of FIG. 7, the equivalent insulation resistances RU-IGBT1, RU-IGBT2 and RU-IGBT3 of the upper arm IGBTs of the first inverter unit 501, the second inverter unit 502 and the third inverter unit 503, shown in FIG. 6, are shorted out.

In FIGS. 6 and 7, RU-IGBT1, RU-IGBT2 and RU-IGBT3 represent the equivalent insulation resistances of the upper arm IGBTs of the first inverter unit 501, the second inverter unit 502 and the third inverter unit 503, respectively, in an off state. RD-IGBT1, RD-IGBT2 and RD-IGBT3 represent the equivalent insulation resistances of the lower arm IGBTs of the first inverter unit 501, the second inverter unit 502 and the third inverter unit 503, respectively, in an off state. Rm1, Rm2 and Rm3 represent the insulation resistances between the motor coils of the first motor 61, the second motor 62 and the third motor 63 and the ground, respectively. Rc represents serial connection of a voltage dividing resistance and a detection resistance of the voltage and current detector 7, as one resistance.

In the three-phase inverter for driving the three-phase motor, as shown in FIG. 4, the inverter is constituted of the three upper arm semiconductor switching elements (IGBTs) and the three lower arm semiconductor switching elements (IGBTs). Collector terminals and emitter terminals of the three upper arm IGBTs of the same inverter and collector terminals and emitter terminals of the three lower arm IGBTs are connected in parallel through the DC link unit and the motor coils inside the motor. Thus, as shown in the equivalent circuits of FIGS. 6 and 7, the resistances of the IGBTs are represented as one composite resistance in which three upper arm or lower arm IGBTs of each inverter are connected in parallel.

As is apparent from the equivalent circuit of FIG. 7, all of the IGBTs in an off state, and more specifically the equivalent insulation resistances RD-IGBT1, RD-IGBT2 and RD-IGBT3 of the lower arm IGBTs of the first inverter unit 501, the second inverter unit 502, and the third inverter unit 503 are directly connected to the DC link unit positive terminal and the DC link unit negative terminal. Leakage currents flow through the IGBTs in the off state directly from the DC link unit positive terminal to the DC link unit negative terminal, without flowing through the detection resistance of the voltage and current detector 7, thus having no effect on the first measurement results. Therefore, the IGBTs in the off state are negligible in the measurement.

Figure 8:
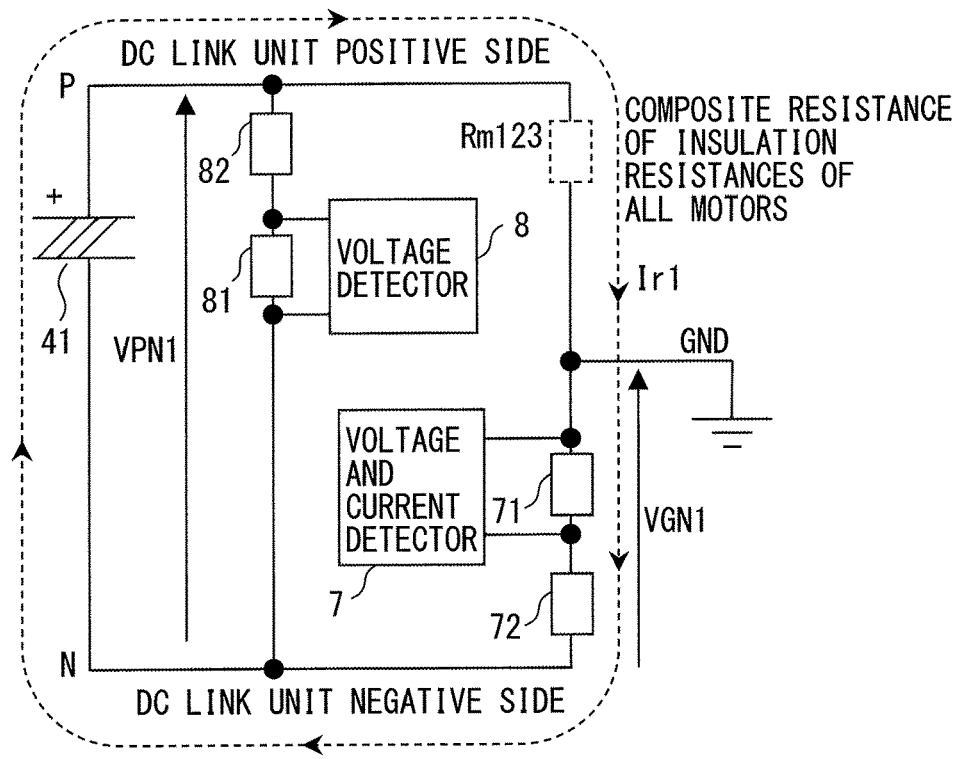
FIG. 8 is an equivalent circuit in which a portion unrelated to the first measurement results is omitted from the equivalent circuit of FIG. 7, and a voltage and current detector and a voltage detector, each including a detection resistance and a voltage dividing resistance, are represented.

FIG. 8 is an equivalent circuit in which a portion unrelated to the first measurement results is omitted from the equivalent circuit of FIG. 7, and the voltage and current detector 7 and the voltage detector 8, each including the detection resistance and the voltage dividing resistance, are represented in the same manner as FIG. 4.

As shown in FIG. 8, the equivalent circuit for measuring the first measurement results is a simple circuit having only one closed circuit in which the composite resistance Rm123 of the insulation resistances of all the motors and the serial connection of the detection resistance 71 and the voltage dividing resistance 72 of the voltage and current detector 7 are connected at both ends of the capacitor 41. The composite resistance Rm123 is concretely a composite resistance in which the insulation resistances Rm1, Rm2 and Rm3 of the first motor, the second motor, and the third motor are connected in parallel (a portion enclosed by an alternate long and short dashed line in FIG. 7).

As the first measurement results, the voltage detector 8 measures a voltage VPN1 (DC link voltage) across the capacitor 41, and the voltage and current detector 7 measures a voltage VGN1 between the DC link unit negative terminal and the ground (GND) and a current Ir1 flowing through the detection resistance 71. Since the voltage applied to the composite resistance Rm123 of the insulation resistances of all the motors is calculated by VPN1−VGN1, and a current flowing through the composite resistance Rm123 is Ir1, the value of the composite resistance Rm123 of the insulation resistances of all the motors can be calculated from the first measurement results as (VPN1−VGN1)/Ir1 with high accuracy.

The composite resistance of the insulation resistances of all the motors, which is obtained from the first measurement results as described above, is affected neither by the insulation resistances of the semiconductor switching elements of the inverter units, nor by the insulation resistances of the other motors, in principle, thus allowing a measurement with high accuracy. This is apparent from the equivalent circuit (FIG. 8) for obtaining the first measurement results.

Figure 9:
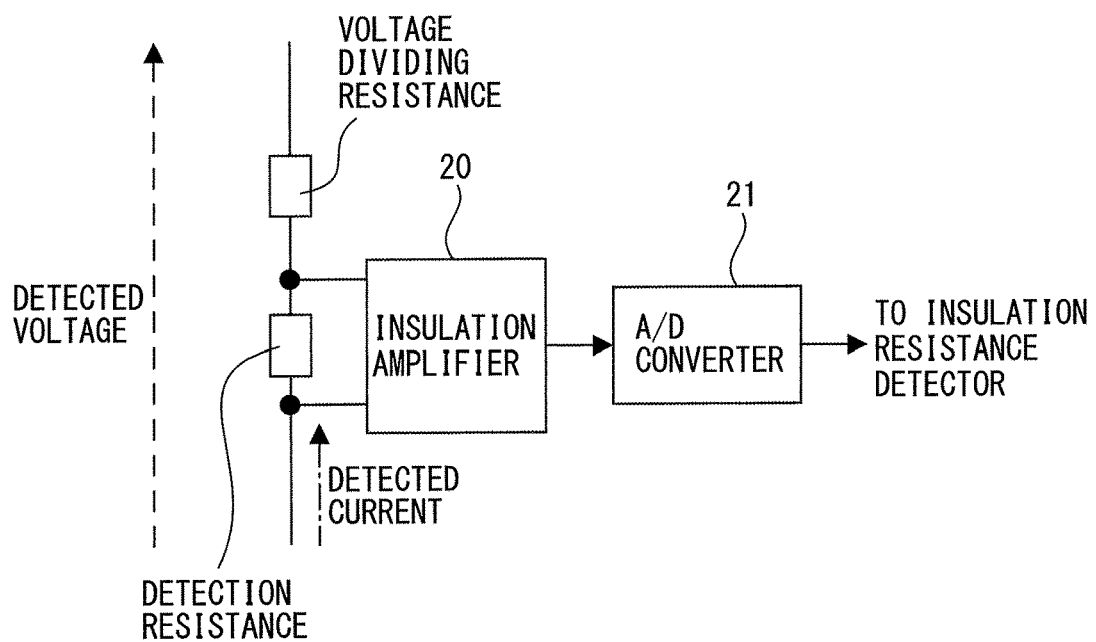
FIG. 9 is a drawing showing the concrete configuration of a measurement circuit of the voltage detector and a measurement circuit of the voltage and current detector.

FIG. 9 shows an example of the concrete configuration of a measurement circuit of the voltage detector 8, which measures a voltage across the capacitor 41, and a measurement circuit of the voltage and current detector 7, which measures a current flowing between the one terminal of the capacitor 41 and the ground and a voltage between the one terminal of the capacitor 41 and the ground, upon turning on the second switch 9.

As shown in FIG. 9, both of the voltage and current detector 7 and the voltage detector 8 are constituted of a circuit for measuring a voltage across the detection resistance, and a voltage dividing resistance connected in series with the detection resistance.

In the measurement circuit, as shown in FIG. 9, the values of the detection resistance and the voltage dividing resistance are already known. Thus, by obtaining only a voltage across the detection resistance, the measurement circuit can be used as a current measurement circuit that calculates a current flowing through the detection resistance from the value of the detection resistance. Moreover, the measurement circuit can be used as a voltage measurement circuit that calculates a voltage across the serial connection of the voltage dividing resistance and the detection resistance from a voltage dividing ratio of the resistances.

Therefore, when the measurement circuit shown in FIG. 9 is used as the voltage and current detector 7, the measurement of only a voltage across the detection resistance also serves as both of the measurement of a current between the one terminal of the capacitor 41 and the ground and the measurement of a voltage between the one terminal of the capacitor 41 and the ground, upon turning on the second switch 9.

As described above, according to the measurement circuit used as the voltage and current detector 7, when the resistance value of each component constituting the measurement circuit is known, detecting only one of a current value and a voltage value allows calculating the other. Such a measurement circuit may be used as the voltage and current detector 7.

As a matter of course, a current detection circuit using a Hall element and the like may be provided separately from a voltage detection circuit, as the measurement circuit for the voltage and current detector 7, and a current and a voltage may be measured by the separate circuits.

On the other hand, the voltage detector 8 uses the circuit of FIG. 9 as only a voltage measurement circuit that measures a voltage across the serial connection of the detection resistance.

Note that, both of the detection resistances of the voltage and current detector 7 and the voltage detector 8 are connected to primary circuits. Thus, a voltage across the detection resistance is converted into a secondary potential i.e. a detection voltage using an insulation amplifier 20, and the detection voltage is inputted to an A/D converter 21 and converted into a digital value (step S105).

The A/D converter 21 performs A/D conversion at the timing commanded by the insulation resistance detector 70. The measurement value converted into the digital value is read into the insulation resistance detector 70 as first measurement results, and used in calculation of insulation resistance values of the motors of each group by the insulation resistance detector 70 (step S108).

Next, in step S106, all the motors are divided into two groups i.e. a group A and a group B. The on/off states of the semiconductor switching elements of each inverter unit are changed in accordance with the groups.

As to the inverter unit connected to the motor belonging the group A, semiconductor switching elements that are connected between the other terminal of the capacitor and the motor coil of the motor are turned on, out of the upper arm or lower arm semiconductor switching elements. Thus, the motor coils of the motor belonging to the group A have the same potential as the other terminal of the capacitor.

In the embodiment of FIG. 4, the second switch 9 connects the DC link unit negative terminal 43 i.e. the negative terminal of the capacitor 41 to the ground. Thus, out of the IGBTs (511 to 561) of the first inverter unit 501 connected to the first motor 61 belonging to the group A, the upper arm IGBTs (511, 531 and 551) that are connected between the DC link unit positive terminal 42, which is the positive terminal of the capacitor 41 on the opposite side to a side connected to the ground through the second switch 9, and the motor coils (611, 621 and 631) are turned on.

In the same manner as step S104, the IGBT of any phase, out of the U-phase, the V-phase and the W-phase, may be turned on as long as the IGBT is the upper arm IGBT of the first inverter unit 501, and the number of the IGBTs to be turned on may be one or two or more. In this embodiment, only the upper arm U-phase IGBT 511 is turned on.

On the other hand, as to the inverter units connected to the motors belonging to the group B, semiconductor switching elements that are connected between the one terminal of the capacitor and the motor coils are turned on, out of the upper arm or lower arm semiconductor switching elements, so that all the motor coils of the motors belonging to the group B have the same potential as the one terminal of the capacitor.

In the embodiment of FIG. 4, as described above, the second switch 9 connects the DC link unit negative terminal 43 to the ground. Thus, out of the IGBTs of the second inverter unit 502 and the third inverter unit 503 connected to the motors belonging to the group B, the lower arm IGBTs that are connected to the DC link unit negative terminal 43 are turned on.

In the second inverter unit 502 and the third inverter unit 503, the IGBT of any phase, out of the U-phase, the V-phase and the W-phase, may be turned on as long as the IGBT is the lower arm IGBT, and the number of the IGBTs to be turned on may be one or two or more.

In this embodiment, the lower arm V-phase IGBT 542 is turned on in the second inverter unit 502. The lower arm W-phase IGBT 563 is turned on in the third inverter unit 503.

Thus, the motor coils (612, 622, 632, 613, 623 and 633) of the second motor 62 and the third motor 63 i.e. the motors belonging to the group B have the same potential as the DC link unit negative terminal 43.

As described above, the predetermined semiconductor switching elements are turned on in both of the inverter unit connected to the motor belonging to the group A and the inverter units connected to the motors belonging to the group B. Next, in step S107, the voltage and current detector measures a current flowing between the one end of the capacitor and the ground and a voltage between the one end of the capacitor and the ground, while the voltage detector measures a voltage across the capacitor, to obtain second measurement results.

Figure 10:
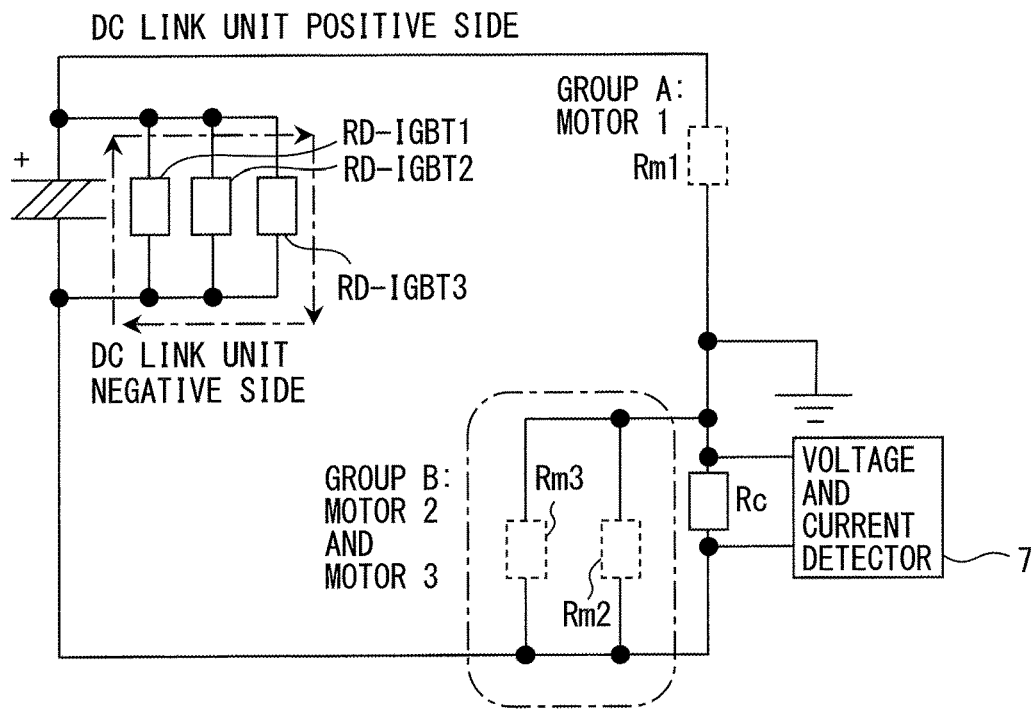
FIG. 10 is an equivalent circuit when measuring second measurement results, in the embodiment of FIG. 4.

FIG. 10 is an equivalent circuit when measuring the "second measurement results", in the embodiment of FIG. 4.

One (511) of the upper arm IGBTs is turned on in the first inverter unit 501 belonging to the group A, and one (542 and 563) of the lower arm IGBTs is turned on in each of the second inverter unit and the third inverter unit belonging to the group B, from the state of FIG. 6.

Thus, in the equivalent circuit of FIG. 10, the equivalent insulation resistance RU-IGBT1 of the upper arm IGBTs of the first inverter unit 501 and the equivalent insulation resistances RD-IGBT2 and RD-IGBT3 of the lower arm IGBTs of the second inverter unit 502 and the third inverter unit 503, shown in FIG. 6, are shorted out.

As is apparent from the equivalent circuit of FIG. 10, all IGBTs in an off state, and more specifically the equivalent insulation resistance RD-IGBT1 of the lower arm IGBTs of the first inverter unit 501 and the equivalent insulation resistances RU-IGBT2 and RU-IGBT3 of the upper arm IGBTs of the second inverter unit 502 and the third inverter unit 503 are directly connected to the DC link unit positive terminal and the DC link unit negative terminal.

Leakage currents flow through the IGBTs in the off state directly from the DC link unit positive terminal to the DC link unit negative terminal, without flowing through the detection resistance of the voltage and current detector 7, thus having no effect on the second measurement results. In the same manner as the measurement of the first measurement results, the IGBTs in the off state are negligible in the measurement of the second measurement results.

Figure 11:
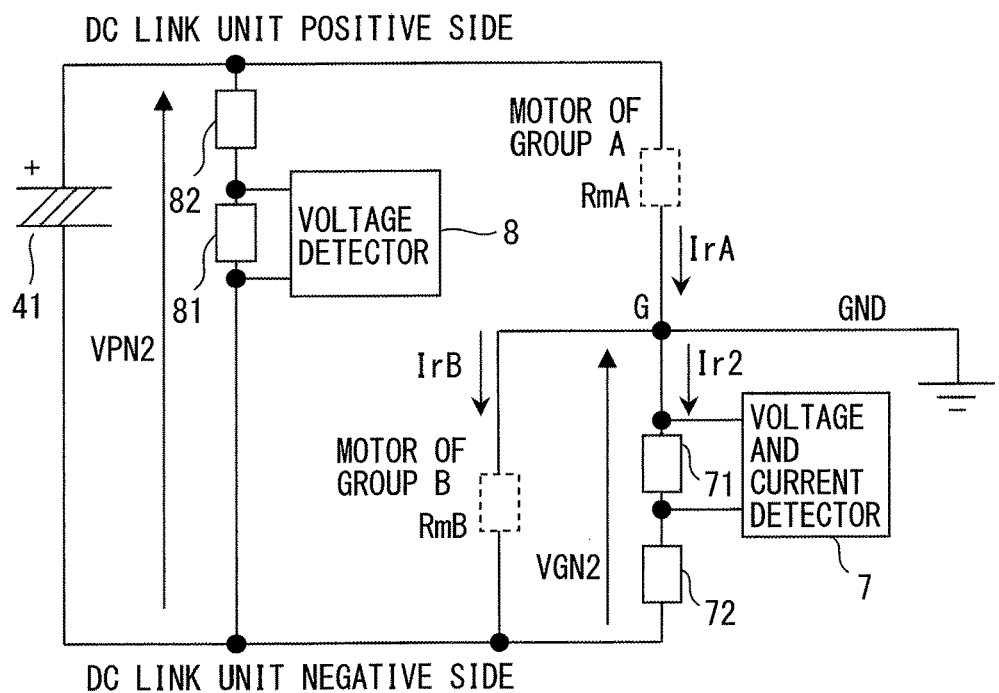
FIG. 11 is an equivalent circuit in which a portion unrelated to the second measurement results is omitted from the equivalent circuit of FIG. 10, and the voltage and current detector and the voltage detector, each including the detection resistance and the voltage dividing resistance, are represented.

FIG. 11 is an equivalent circuit in which a portion unrelated to the second measurement results is omitted from the equivalent circuit of FIG. 10, and the voltage and current detector 7 and the voltage detector 8, each including the detection resistance and the voltage dividing resistance, are represented in the same manner as FIG. 4.

As shown in FIG. 11, in the equivalent circuit for measuring the second measurement results, the insulation resistance RmA of the motor of the group A and the serial connection of the detection resistance 71 and the voltage dividing resistance 72 of the voltage and current detector 7 are connected at both ends of the capacitor 41, and in addition, the insulation resistance RmB of the motors of the group B is connected in parallel with the serial connection of the detection resistance 71 and the voltage dividing resistance 72 of the voltage and current detector 7.

In the embodiment of FIG. 4, the first motor 61 belongs to the group A, while the other motors i.e. the second motor 62 and the third motor 63 belong to the group B. Thus, RmA of FIG. 11 is equal to the insulation resistance Rm1 of the first motor 61 of FIGS. 4 and 10. RmB of FIG. 11 is equal to the composite resistance of the parallel-connected insulation resistances Rm2 and Rm3 of the second motor and the third motor of FIGS. 4 and 10 (a portion enclosed by an alternate long and short dashed line in FIG. 10).

Next, in step S108, insulation resistance values of the group A and the group B are calculated using the first measurement results and the second measurement results.

An embodiment for calculating insulation resistance values of the group A and the group B, using the first measurement results and the second measurement results, will be described below.

In the equivalent circuit of FIG. 11 for the measurement of the second measurement results, IrA represents a current value flowing through the insulation resistance RmA of the motor belonging to the group A, IrB represents a current value flowing through the insulation resistance RmB of the motors belonging to the group B, and Ir2 is a current value flowing through the detection resistance of the voltage and current detector 7.

In FIG. 11, applying Kirchhoff's first law to a node G, since the sum of currents flowing into one node from all branches connected to the node is 0, the following relational expression is obtained.

$$IrA = IrB + Ir2 \tag{1}$$

When each of IrA, IrB and Ir2 is represented using VPN2 and VGN2 of the second measurement results, the insulation resistance value RmA of the motor belonging to the group A, the insulation resistance value RmB of the motors belonging to the group B, and the resistance value Rc of the serial connection of the detection resistance 71 and the voltage dividing resistance 72 of the voltage and current detector 7, the following relational expressions are obtained.

$$IrA = \frac{(VPN2 - VGN2)}{RmA}$$

$$IrB = \frac{VGN2}{RmB}$$

$$Ir2 = \frac{VGN2}{Rc}$$

Substituting these expressions into the above expression (1), the following expression (2) is obtained.

$$\frac{(VPN2 - VGN2)}{RmA} = \frac{VGN2}{RmB} + \frac{VGN2}{Rc} = VGN2\left(\frac{1}{RmB} + \frac{1}{Rc}\right) \tag{2}$$

Simplifying the expression (2) brings the following expression (3).

$$\frac{VPN2}{RmA} = VGN2\left(\frac{1}{RmA} + \frac{1}{RmB} + \frac{1}{Rc}\right) \tag{3}$$

When RmAB represents the composite resistance value of the parallel-connected RmA and RmB, RmAB can be represented by the following expression (4) using RmA and RmB.

$$\frac{1}{RmAB} = \left(\frac{1}{RmA} + \frac{1}{RmB}\right) \tag{4}$$

Substituting the expression (4) into the expression (3), the following expression (5) is obtained.

$$\frac{VPN2}{RmA} = VGN2\left(\frac{1}{RmAB} + \frac{1}{Rc}\right) \tag{5}$$

Simplifying the expression (5) brings the following expression (6) to calculate the insulation resistance value RmA of the motor belonging to the group A.

$$RmA = \frac{VPN2}{VGN2} \times \frac{RmAB \times Rc}{(RmAB + Rc)} \tag{6}$$

RmAB is the composite resistance value of the insulation resistance RmA of the motor belonging to the group A and the insulation resistance RmB of the motors belonging to the group B, and is equal to the composite resistance value of the parallel-connected insulation resistances of all the motors.

Since all the motors are divided into the two groups i.e. the group A and the group B, it is apparent that the composite resistance value of the insulation resistance RmA of the motor belonging to the group A and the insulation resistance RmB of the motors belonging to the group B is equal to the composite resistance value of the parallel-connected insulation resistances of all the motors.

The insulation resistance value of all the motors, in other words, the composite resistance value of the insulation resistance RmA of the motor belonging to the group A and the insulation resistance RmB of the motors belonging to the group B connected in parallel is represented by the following relational expression (7), from the first measurement results measured in advance and the equivalent circuit of FIG. 8.

$$RmAB = \frac{(VPN1 - VGN1)}{Ir1} \tag{7}$$

When the composite resistance value of the serial connection of the detection resistance 71 and the voltage dividing resistance 72 of the voltage and current detector 7 is represented using Rc, Ir1 is represented by the following expression (8).

$$Ir1 = \frac{VGN1}{Rc} \tag{8}$$

Substituting the expression (8) into the expression (7), an expression (9) for calculating the insulation resistance value RmAB of all the motors from the first measurement results is obtained.

$$RmAB = Rc \times \left(\frac{VPN1}{VGN1} - 1\right) \quad (9)$$

VPN1 and VGN1 obtained from the first measurement results are substituted into the above expression (9) to calculate RmAB. The value of RmAB is substituted into the above expression (6), to calculate the insulation resistance value RmA of the motor belonging to the group A.

When the insulation resistance value RmA of the motor belonging to the group A is obtained, the insulation resistance value RmB of the remaining group B can be calculated. Since the above expression (4) represents the relationship between the insulation resistance value RmAB of all the motors, the insulation resistance value RmA of the motor belonging to the group A, and the insulation resistance value RmB of the motors belonging to the group B, simplifying the expression (4) brings the following expression (10) to calculate the insulation resistance value RmB of the group B.

$$RmB = \frac{RmA \times RmAB}{(RmA - RmAB)} \quad (10)$$

In the above embodiment for the calculation, the insulation resistance value RmAB of all the motors is calculated once using the first measurement results, and thereafter each of the insulation resistance value RmA of the group A and the insulation resistance value RmB of the group B is calculated using the insulation resistance value RmAB of all the motors and the second measurement results.

However, the insulation resistance value RmAB of all the motors may not be calculated. Assuming that the insulation resistance value RmAB is a variable of the first measurement results, the insulation resistance value RmA of the group A and the insulation resistance value RmB of the group B may be directly calculated using the first measurement results and the second measurement results.

In the embodiment of FIG. 4, the measurement is performed in a state that, out of the three motors in total, the first motor 61 chosen as a target motor belongs to the group A, while the other motors i.e. the second motor 62 and the third motor 63 belong to the group B. Thus, as the measurement results, the insulation resistance value Rm1 of the first motor 61 is obtained as the insulation resistance value RmA of the motor belonging to the group A, and the composite resistance value of the parallel-connected insulation resistances Rm2 and Rm3 of the second motor 62 and the third motor 63 are obtained as the insulation resistance value RmB of the motors belonging to the group B.

The present invention allows the measurement of the insulation resistance values of both of the group A and the group B with high accuracy. Therefore, when arbitrary one of motors is chosen as a target motor and the insulation resistance value of the target motor is measured, the target motor may be assigned to the group A, while the other motors may be assigned to the group B. On the contrary, the target motor may be assigned to the group B, while the other motors may be assigned to the group A.

In the embodiment of FIG. 4, the group A has one motor, but the number of motors belonging to each of the group A and the group B may be one or two or more. When two or more motors belong to the same group, an obtained insulation resistance value is the composite resistance value of the parallel-connected insulation resistances of the two or more motors belonging to the same group.

After the measurement, the second switch is turned off, and all the IGBTs of all the inverter units are turned off (step S109).

In this embodiment, the upper arm semiconductor switching elements or the lower arm semiconductor switching elements are necessarily turned on in every inverter unit connected to the motor, in the cases of measuring the first measurement results and the second measurement results. This is for the purpose of connecting at least one phase of a terminal of the motor coil to any one of the DC link unit positive terminal and the DC link unit negative terminal in every motor.

Therefore, in the case of a multi-level inverter in which a plurality of semiconductor switching elements are connected in series between one end of the DC link unit and the motor coil, all of the semiconductor switching elements connected in series between the one end of the DC link unit and the motor coil may be turned on.

In the cases of measuring the first measurement results and the second measurement results, the measurement of a voltage and a current by the voltage and current detector 7 is performed in the same timing as the measurement of a voltage across the capacitor by the voltage detector 8. This is because the voltage of the capacitor 41 is gradually reduced during the measurement. To establish the relationship between voltage and current of each component in the equivalent circuits of FIGS. 7 and 8 and FIGS. 10 and 11, the current value and the voltage values are required to be measured at the same timing.

The insulation resistance detector 70 of the motor driver 101 performs all of the above-described operations related to the measurement of insulation resistance values of the motors. In the embodiment of FIG. 4, the "insulation resistance detector" 70 is embodied by a microcomputer. The microcomputer issues commands at appropriate timing in accordance with the flowchart of FIG. 5 to perform operations required for the measurement, such as on/off operations of the semiconductor switching elements of each inverter unit, on/off operations of the first switch 1 and the second switch 9, A/D conversion commands to the A/D converters of the voltage detector 8 and the voltage and current detector 7 and the read of converted data, and calculation of the insulation resistance value of a target motor.

Sequentially performing a series of the above-described operations allows detection of insulation resistance values to be measured.

None of the insulation resistance value RmA of the motor of the group A and the insulation resistance value RmB of the motors of the group B measured as described above has the problem of a reduction in measurement accuracy due to the effects of the insulation resistances of the semiconductor switching elements of the inverter in an off state, and the problem of a reduction in measurement accuracy due to the effects of the insulation resistances of the non-target motors, in principle. Therefore, the present invention allows measurement of insulation resistance values with high accuracy.

None of the first and second measurement results is affected by the insulation resistances of the semiconductor switching elements of the inverter in an off state, in principle. This is apparent from the equivalent circuits of FIGS. 7, 8, 10 and 11, because leakage currents flow through the semiconductor switching elements (IGBTs) in an off state directly from the DC link unit positive terminal to the DC link unit negative terminal, without flowing through the detection resistance of the voltage and current detector 7, thus having no effect on the measurement results.

In a motor driver for driving a plurality of motors, a case is considered in which an arbitrary motor is chosen from the motors and the insulation resistance value of the chosen motor is measured. In this case, according to the conventional art, the motors are divided into two groups, i.e. a group of a target motor and a group of the other motors. After that, assuming that there is no motor other than the target motor in a measurement circuit, by separating the other motors from the measurement circuit and changing connection so as to have no effect on measurement, the insulation resistance value of only the target motor is measured. However, in actual fact, the other motors, as well as the target motor, are connected in the measurement circuit, and therefore there is a fundamental problem that measurement accuracy of the insulation resistance value of the target motor is reduced owing to the effects of the insulation resistances of the other motors.

In the conventional art described in Patent Document 2, the insulation resistances of non-target motors are connected in parallel with a current detector. Thus, a current that is intended to flow through the insulation resistance of a target motor partly flows through the insulation resistances of the non-target motors, without passing through the current detector, thus causing a reduction in measurement accuracy of the insulation resistance value of the target motor.

On the contrary, according to the present invention, all the motors are divided into arbitrary two groups i.e. a group A and a group B, and both of the insulation resistance value of a motor belonging to the group A and the insulation resistance value of motors belonging to the group B are measured. The present invention is basically different from the conventional art in terms that the measurement is performed on the precondition that both of the insulation resistance of the motor belonging to the group A and the insulation resistances of the motors belonging to the group B are connected to a measurement circuit.

The present invention performs a measurement, while assuming that both of the insulation resistance value of a motor belonging to a group A and the insulation resistance value of motors belonging to a group B are to be measured from the beginning. Since there are two targets, the measurement has to be performed twice to obtain two types of measurement results i.e. first measurement results and second measurement results. However, the present invention does not have the problem of a reduction in measurement accuracy, owing to the effects of the insulation resistances of non-target motors, in principle.

In the present invention, when the insulation resistance values of motors are measured a plurality of times while changing grouping of the motors, a measurement operation has to be performed twice in a first measurement using the first groups, to obtain the first measurement results and the second measurement results. However, when subsequently performing second and later measurements with new groups, the first measurement results that are obtained by the first measurement using the first groups may be shared to calculate the insulation resistance value RmA of a motor belonging to a group A and the insulation resistance value RmB of motors belonging to a group B, and a measurement operation for obtaining first measurement results may be omitted from the second and later measurements.

This is because when the insulation resistance values of motors are measured a plurality of times in a short time period, the composite resistance of the insulation resistances of all the motors, i.e. the first measurement results is regarded to be the same in the first measurement and in the second or later measurement.

In general, deterioration of insulation of motors installed in machine tools and the like, which are used in environment in which the motors are always exposed to liquid such as a cutting fluid and a coolant, is a phenomenon in which the insulation resistance between a motor coil and a ground is gradually reduced over time of several years, due to the liquid such as the cutting fluid and the coolant getting into the motors little by little. Therefore, it is conceivable that the insulation resistance value of each motor does not change in such a short time period of sequentially performing the measurement a plurality of times, to such an extent that the insulation resistance of each motor has an effect on the measurement results.

Figure 12:
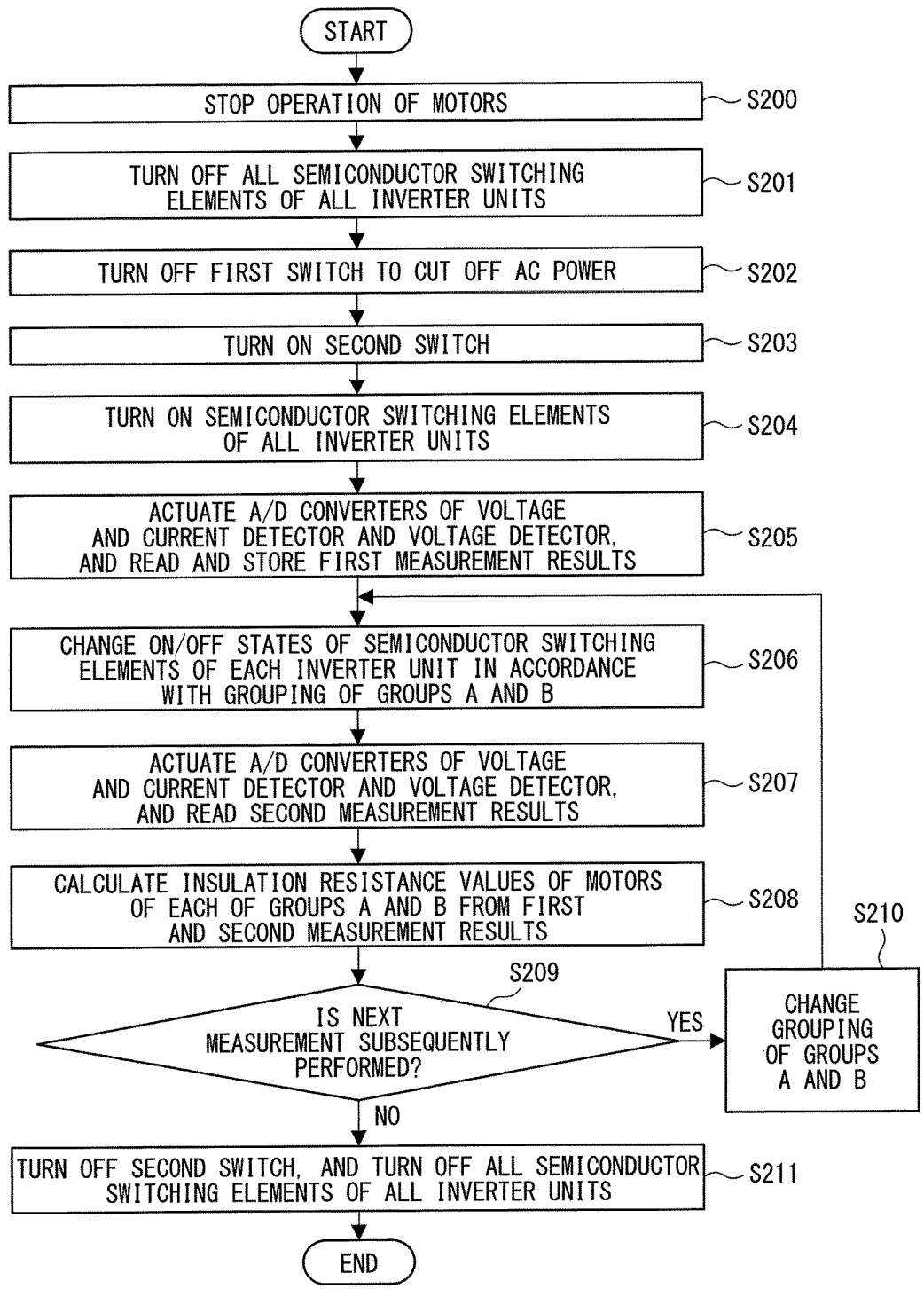
FIG. 12 is a flowchart of a procedure for detecting deterioration of insulation using a motor driver according to a second embodiment of the present invention.

FIG. 12 is a flowchart of a procedure for detecting deterioration of insulation using a motor driver according to a second embodiment of the present invention.

To measure the insulation resistance values of motors a plurality of times, while changing combinations of the motors constituting a group A and a group B, in other words, changing grouping of the motors, as shown in FIG. 12, the insulation resistance detector 70 performs a measurement operation to obtain first measurement results. Next, the first measurement results obtained by the measurement operation are stored in the insulation resistance detector 70 (steps S200 to S205). Subsequently, the on/off states of the semiconductor switching elements of each inverter unit are changed in accordance with the groups, and the insulation resistance detector 70 performs a measurement operation to obtain second measurement results. The insulation resistance value RmA of a motor belonging to the group A and the insulation resistance value RmB of motors belonging to the group B are calculated using the first measurement results and the second measurement results (steps S206 to S208). Details of operation performed in each step of the first measurement with the initial groups are the same as those of the first embodiment, except that the first measurement results are stored for second and later measurements.

Next, to continue measurements, the combinations of the motors constituting the group A and the group B i.e. grouping of the motors are changed (step S210), and thereafter the second or later measurement is performed. To be more specific, the on/off states of the semiconductor switching elements of each inverter unit are changed in accordance with the changed groups, and the insulation resistance detector 70 performs a measurement to obtain only second measurement results. The insulation resistance value RmA of a motor belonging to the new group A and the insulation resistance RmB of motors belonging to the new group B are calculated (steps S206 to S208).

In the second and later measurements, the first measurement results having the values obtained in the first measurement with the initial groups are shared to calculate the insulation resistance value RmA of the motor belonging to the group A and the insulation resistance value RmB of the motors belonging to the group B. On the other hand, the second measurement results have values obtained in the second or later measurement with the changed groups.

To measure the insulation resistance values of the motors sequentially, as described above, steps S206 to S210 are performed repeatedly whenever the groups of the motors are changed. When a subsequent measurement is not required to be performed, after a measurement for the last motor is completed, the operation proceeds from step S209 to step S211 to complete the measurements.

The motor driver according to the second embodiment of the present invention has the same configuration as the motor driver according to the first embodiment. The motor driver according to the second embodiment of the present invention will be described with reference to FIG. 4.

In this embodiment, in the system of FIG. 4, a measurement to obtain the insulation resistance value of arbitrary one of the three motors i.e. the first motor 61, the second motor 62, and the third motor 63 is performed three times, while sequentially choosing one of the motors as a target motor, in order to measure the insulation resistance value of each individual of all the three motors.

To be more specific, a measurement is performed three times in total, by assigning the first motor 61 to a group A in the first measurement, assigning the second motor 62 to a group A in the second measurement, and assigning the third motor 63 to a group A in the third measurement. Thus, the insulation resistance values Rm1, Rm2 and Rm3 of the first motor 61, the second motor 62 and the third motor 63 are measured as the insulation resistance value RmA of the group A obtained in each measurement.

Table 1 shows details of groups and measurement operations in each of the first to third measurements, when the above-described measurement is performed three times in a row in accordance with the flowchart of FIG. 12. As shown in Table 1, both of the measurement operation (steps S200 to S205 of FIG. 12) to obtain first measurement results and the measurement operation (steps S206 to S208 of FIG. 12) to obtain second measurement results are performed only in the first measurement, and RmA is calculated from the obtained first measurement results and second measurement results.

Subsequently, after changing grouping of the motors such that the second motor 62, instead of the first motor 61, belongs to the group A, the second measurement is performed. In the second measurement, only the measurement operation (steps S206 to S208 of FIG. 12) to obtain second measurement results is performed, without performing a measurement operation to obtain first measurement results. As to the first measurement results, the values of the first measurement results obtained in the first measurement are shared to calculate an insulation resistance value. The third measurement is performed in the same manner as the second measurement. Since the third measurement is the last measurement, the third measurement (steps S206 to S208 of FIG. 12) is performed, and thereafter the measurements are completed in accordance with steps S209 and S211 of FIG. 12.

TABLE 1

Details of Groups and Measurement Operations

| | group A | group B | first measurement results | second measurement results |
|---|---|---|---|---|
| first measurement | first motor 61 | second motor 62 and third motor 63 | measured | measured |
| second measurement | second motor 62 | first motor 61 and third motor 63 | not measured (shared use of values obtained in first measurement) | measured |
| third measurement | third motor 63 | second motor 62 and first motor 61 | not measured (shared use of values obtained in first measurement) | measured |

In this embodiment, the microcomputer of the insulation resistance detector 70 measures the insulation resistance values of the motors three times, using the groups and order shown in Table 1. The measurements of the insulation resistance values of all the three motors are programmed in advance, and the microcomputer of the insulation resistance detector 70 performs all required processes. However, an external host controller may issue commands that indicate which measurement uses what group to measure the insulation resistance values of the motors, to the microcomputer of the insulation resistance detector 70.

In this embodiment, as a method for measuring the insulation resistance value of one target motor, a measurement is performed in a state that the one motor is assigned to a group A, while the remaining two motors are assigned to a group B. Thus, the insulation resistance value of the target motor is obtained from the insulation resistance value RmA of the group A. However, the present invention can measure the insulation resistance value of the motors belonging to the group B, as well as the insulation resistance value of the motor belonging to the group A, with high accuracy. Therefore, the one motor chosen as a target motor may be assigned to a group B, while the remaining two motors may be assigned to a group A.

This embodiment describes a case in which the insulation resistance values of all the three motors are sequentially measured one by one in the configuration of the motor driver as shown in FIG. 4. However, measurements for all the motors are not necessarily performed. If there is a non-target motor, measurements may be completed when insulation resistance values of all target motors have been measured.

In the present invention, one measurement of the insulation resistance value of a motor requires two measurement operations, i.e. a measurement operation for obtaining first measurement results and a measurement operation for obtaining second measurement results. However, when insulation resistance values of motors are measured a plurality of times in a row within a short time period, as shown in the flowchart of FIG. 12, only a measurement operation for obtaining second measurement results may be performed in second and later measurements, by omitting a measurement operation for obtaining first measurement results. Therefore, the number of measurement operations to measure the insulation resistance values of the motors is not twice the number of measurements, but is the number of measurements plus 1. A fewer number of measurement operations result in short measurement time.

FIG. 13 is a flowchart of a procedure for detecting deterioration of insulation using a motor driver according to a third embodiment of the present invention.

The motor driver having the function of detecting insulation resistance values of motors is installed in a machine tool or the like, and used in maintenance and conservation activity of the machine mainly in a production site of a plant.

What is important for the maintenance and conservation activity of the machine in the production site of the plant is to initially check whether or not there is a motor having a reduced insulation resistance value, in other words, deteriorated insulation, out of all of a plurality of motors used in the machine.

When it is determined as a result of the check that there is no motor having deteriorated insulation, out of all the motors used in the machine, in other words, all the motors have an insulation resistance value that is equal to or higher than a reference value, the insulation resistance value of each motor is not required to be measured.

On the other hand, when it is determined as a result of the check that there is a motor having deteriorated insulation, out of all the motors used in the machine, in other words, at least one of the motors has an insulation resistance value that is lower than the reference value, the insulation resistance values of the individual motors are required to be measured continuously.

The present invention calculates a composite resistance value, which is a resistance value when the insulation resistances of all the motors are connected in parallel, is calculated from first measurement results performed initially, and thereby it is possible to check whether or not there is a motor having a reduced insulation resistance value, in other words, deteriorated insulation at the beginning. When it is determined that the composite resistance value, which is the resistance value of the insulation resistances of all the motors connected in parallel, is equal to or higher than the reference value, and none of the motors has a problem of deteriorated insulation, the measurement is completed at this point.

On the other hand, when the composite resistance value, which is the resistance value of the insulation resistances of all the motors connected in parallel, calculated from the first measurement results is lower than the reference value, measurement operations for obtaining only second measurement results may be performed continuously to calculate the insulation resistance values of the individual motors, for the purpose of identifying which motor deteriorates what degree.

As described above, since the operation procedure of the present invention coincides with operation order of the actual conservation activity, measurements can be performed without waste with high accuracy.

A concrete procedure of the third embodiment of the present invention will be described with reference to the flowchart of FIG. 13. First, the insulation resistance detector 70 performs a measurement operation to obtain first measurement results. The first measurement results obtained by the measurement operation is stored in the insulation resistance detector 70 (steps S300 to S305). Subsequently, the insulation resistance detector 70 calculates the composite resistance value of all the motors using the first measurement results (step S306).

A method for calculating the composite resistance value of the insulation resistances of all the motors using the first measurement results is described above, and hence omitted here. Next, in step S307, the insulation resistance detector 70 determines whether or not the composite resistance value of the insulation resistances of all the motors is equal to or higher than a reference value.

It is apparent from description about the equivalent circuits of FIGS. 7 and 8 that the composite resistance value of the insulation resistances of all the motors calculated using the first measurement results is the composite resistance value of the insulation resistances of all the motors connected in parallel. Accordingly, when the composite resistance value of the insulation resistances of all the motors calculated using the first measurement results is higher than the reference value, the insulation resistance value of each motor is regarded to be higher than the reference value.

The reference value is predetermined in the insulation resistance detector 70, which performs step S306, but may be changeable from outside. The reference value may be set at the upper limit or the lower limit of an insulation resistance value at which deterioration of insulation is determined to be occurring, in order to determine that the insulation resistance value of every motor is in an adequate level, which is equal to or more than the reference value, or to determine that at least one of the motors has deteriorated insulation.

When the composite resistance value of the insulation resistances of all the motors calculated using the first measurement results is higher than the reference value, none of the motors has deteriorated insulation, and the insulation resistance value of every motor is in an adequate level. Thus, since no more measurement operation is required, as shown in FIG. 12, operation goes to step S313 to end the measurement.

On the other hand, when the composite resistance value of the insulation resistances of all the motors calculated using the first measurement results is lower than the reference value, at least one of the motors has an insulation resistance value that is lower than the reference value. Therefore, the insulation resistance value of each motor is measured continuously, in order to identify which motor deteriorates what degree.

To be more specific, all the motors are divided into a group A and a group B, and thereafter the on/off states of the semiconductor switching elements of each inverter unit are changed in accordance with the groups. The insulation resistance detector 70 performs a measurement operation for obtaining second measurement results. The insulation resistance value RmA of the motor belonging to the group A and the insulation resistance value RmB of the motors belonging to the group B are calculated using the first measurement results and the second measurement results (steps S308 to S316).

The first measurement results used here are values that are measured in steps S300 to S305 to calculate the composite resistance value of the insulation resistances of all the motors. The used second measurement results are values that are measured in steps S300 to S305 after grouping.

To identify which motor has an insulation resistance value that is lower than the reference value, steps S308 to S312 are repeated while changing grouping of the motors. When the insulation resistance value of every motor is measured and which motor deteriorates what degree is identified, no more measurement operation is required, so that operation goes to step S313 to end the measurement.

In this embodiment, steps S308 to S312 are repeated until measurements of the insulation resistance values of all the motors are completed, but the insulation resistance values of all the motors are not necessarily measured.

This is because in actual conservation activity of the machine, the insulation resistance value of each motor is required to be measured only as to a motor having deteriorated insulation and an insulation resistance value that is lower than the reference value. As to a motor having an insulation resistance value that is equal to or higher than the reference value, the insulation resistance value of the motor is not required to be measured, as long as it is known that the insulation resistance value of the motor is equal to or higher than the reference value.

For example, when a certain motor belongs to a group A and the remaining motors belong to a group B, if the insulation resistance value of the group A is lower than the reference value, while the insulation resistance value of the group B is higher than the reference value, it is apparent that only the motor belonging to the group A, out of all the motors, has an insulation resistance value that is lower than the reference value. The concrete insulation resistance value of the group A, which is lower than the reference value, has already been obtained, no more measurement operation is required other than the first measurement.

Including the conventional art, in a method for performing measurement operations while changing a target motor one by one, as described above, if a motor having deteriorated insulation becomes a target motor on a few times of measurement occasion, the motor having deteriorated insulation can be found out in a small number of measurements. On the contrary, a motor having deteriorated insulation becomes a target motor on the last occasion, the motor having deteriorated insulation cannot be identified until the insulation resistance values of all the motors have been measured. As a result, the number of measurements increases with an increase in the number of motors, and thus is not constant.

In the third embodiment of the present invention, the insulation resistance detector 70 records the insulation resistance value of each of all the motors detected by the insulation resistance detector 70, whenever the insulation resistance values are measured, together with information related to the date and time of measurement. When all the motors are divided into a group A and a group B, a motor the insulation resistance value of which is expected to be low from the record, for example, a motor having the lowest insulation resistance value from preceding measurement results having the latest date, is assigned to the group A or the group B. Therefore, which motor deteriorates, what is the insulation resistance value thereof, and which motor does not deteriorate can be found out in a few number of measurements.

In the example of Table 1 with the configuration of FIG. 4, it is assumed that only the third motor 63 has a reduced insulation resistance value, and the other motors i.e. the first motor 61 and the second motor 62 have normal insulation resistance values. At this time, as shown in Table 1, if measurement operations are performed while changing a target motor one by one, it cannot be identified that the third motor 63 has deteriorated insulation, what is the insulation resistance value of the third motor 63, and the first motor 61 and the second motor 62 have high insulation resistance values and no deteriorated insulation, unless the three measurements are performed as shown in Table 1, or the insulation resistance value of the third motor 63 is calculated from first and second measurement results.

Therefore, the insulation resistance detector 70 records the detected insulation resistance value of each of all the motors, whenever the insulation resistance values are measured, together with information related to the date and time of measurement. If the insulation resistance value of the third motor 63 is known to be low from the measurement results of the insulation resistance values of the motors of a few days ago, as shown in Table 2, a first measurement is performed using the same groups as in the third measurement of Table 1. Thus, it is possible to identify that the third motor 63 has deteriorated insulation, what is the insulation resistance value of the third motor 63, and the first motor 61 and the second motor 62 have high insulation resistance values and no deteriorated insulation, only in the first measurement.

TABLE 2

Details of Groups and Measurement Operations

| | group A | group B | information obtained by measurement |
|---|---|---|---|
| first measurement | third motor 63 | second motor 62 and first motor 61 | insulation resistance value of third motor 63 → insulation is deteriorated in third motor 63 and insulation is not deteriorated in the other motors. |

All of the embodiments of the present invention use the voltage and current detector 7 that includes a circuit for measuring a voltage across the serial connection of the detection resistance and the voltage dividing resistance, and a voltage across the detection resistance. The operation of the voltage and current detector 7 having this configuration is described in the above embodiments.

The voltage and current detector 7 can measure both of a voltage and a current with high accuracy with a small number of components, and is a voltage and current detector suited for the present invention that can measure a high insulation resistance value with high accuracy with simple configuration.

According to the present invention, when a motor is chosen from a plurality of motors and a measurement is performed on the chosen motor, deterioration in the insulation resistance of the motor can be detected with higher accuracy than before.

What is claimed is:
1. A motor driver comprising:
a converter unit having a rectifier circuit configured to rectify an AC voltage supplied from an AC power supply through a first switch to a DC voltage;
a power supply unit configured to smooth the DC voltage rectified by the rectifier circuit using a capacitor;
a plurality of inverter units configured to convert the DC voltage from the power supply unit into an AC voltage by switching operation of an upper arm semiconductor switching element connected between a positive terminal of the capacitor and a motor coil and a lower arm semiconductor switching element connected between a negative terminal of the capacitor and the motor coil, to drive a plurality of motors;
a second switch configured to connect one terminal of the capacitor to a ground;
a voltage and current detector configured to measure a current flowing between the one terminal of the capacitor and the ground, and a voltage between the one terminal of the capacitor and the ground;
a voltage detector configured to measure a voltage across the capacitor; and
an insulation resistance detector configured to detect an insulation resistance value of each of the motors driven by the inverter units, wherein the insulation resistance detector determines a voltage value and a current value measured by the voltage and current detector and a voltage value measured by the voltage detector as first measurement results, in the state of stopping the operation of the motors, turning off the first switch while turning on the second switch, and turning on the semiconductor switching element of every motor that is connected between the other terminal of the capacitor and the motor coil, out of the upper arm or lower arm semiconductor switching element of the inverter unit connected to each motor;

the insulation resistance detector calculates a composite resistance value of the insulation resistance of all the motors using the first measurement results;

when the composite resistance value is lower than a reference value, the insulation resistance detector determines a voltage value and a current value measured by the voltage and current detector and a voltage value measured by the voltage detector as second measurement results, in the state of dividing all the motors into two arbitrary groups including a group A and a group B, and as to the motor belonging the group A, turning on the semiconductor switching element connected between the other terminal of the capacitor and the motor coil, out of the upper arm or lower arm semiconductor switching element of the inverter unit connected to each motor, and as to the motor belonging to the group B, turning on the semiconductor switching element connected between the one terminal of the capacitor and the motor coil, out of the upper arm or lower arm semiconductor switching element of the inverter unit connected to each motor; and the insulation resistance detector calculates insulation resistance values between the coil of the motor belonging to the group A and the ground and between coil of the motor belonging to the group B and the ground, using the first measurement results and the second measurement results.

2. The motor driver according to claim 1, wherein the insulation resistance detector further:

stores the voltage value and the current value measured by the voltage and current detector and the voltage value measured by the voltage detector as the first measurement results, in the state of stopping the operation of the motors, turning off the first switch while turning on the second switch, and turning on the semiconductor switching element connected between the other terminal of the capacitor and the motor coil, out of the upper arm or lower arm semiconductor switching element of the inverter unit connected to each motor, of every motor; and sequentially performs a plurality of times of measurement to determine a voltage value and a current value measured by the voltage and current detector and a voltage value measured by the voltage detector as the second measurement results, in the state of dividing all the motors into the two arbitrary groups while changing a motor belonging to each group.

3. The motor driver according to claim 1, wherein the insulation resistance detector records an insulation resistance value of each of all the motors detected by the insulation resistance detector, whenever the insulation resistance values are measured, together with information related to a date and time of measurement, and when calculating the insulation resistance values of the motors, the insulation resistance detector assigns one of the motors the insulation resistance value of which is expected to be low from the record to a group A or B, and detects the insulation resistance values between the motor coil of the group A and the ground and between the motor coil of the group B and the ground.

4. The motor driver according to claim 1, wherein the voltage and current detector includes a circuit configured to measure a voltage across a serial connection of a detection resistance and a voltage diving resistance, and a voltage across the detection resistance, and by measuring the voltage across the detection resistance, a measurement result of a current value is calculated from a resistance value of the detection resistance, and a measurement result of a voltage value is calculated from the voltage across the detection resistance and resistance values of the detection resistance and the voltage dividing resistance.

\* \* \* \* \*